(12) United States Patent
Takeuchi et al.

(10) Patent No.: US 7,262,545 B2
(45) Date of Patent: Aug. 28, 2007

(54) CELL DRIVING TYPE PIEZOELECTRIC/ELECTROSTRICTIVE ACTUATOR AND METHOD OF MANUFACTURING THE SAME

(75) Inventors: Yukihisa Takeuchi, Nishikamo-Gun (JP); Koji Kimura, Nagoya (JP); Koichi Iwata, Kani (JP)

(73) Assignee: NGK Insulators, Ltd., Nagoya (JP)

( * ) Notice: Subject to any disclaimer, the term of this patent is extended or adjusted under 35 U.S.C. 154(b) by 182 days.

(21) Appl. No.: 10/855,448

(22) Filed: May 27, 2004

(65) Prior Publication Data

US 2005/0001514 A1 Jan. 6, 2005

(30) Foreign Application Priority Data

May 30, 2003 (JP) ............................. 2003-155009
May 25, 2004 (JP) ............................. 2004-154950

(51) Int. Cl.
*B41J 2/14* (2006.01)
*B41J 2/045* (2006.01)

(52) U.S. Cl. .................. 310/365; 310/364; 310/366; 347/68; 347/71; 347/72; 347/70

(58) Field of Classification Search ................ 310/328, 310/323.02, 358, 359, 367, 311, 363–366; 347/68, 70–72
See application file for complete search history.

(56) References Cited

U.S. PATENT DOCUMENTS 5,686,946 A 11/1997 Mizutani 6,223,405 B1 * 5/2001 Oikawa et al. ............... 347/68
6,263,550 B1 7/2001 Seipler et al.
2002/0001021 A1 * 1/2002 Tachibana ..................... 347/68
2002/0146330 A1 10/2002 Takeuchi et al.
2002/0168132 A1 11/2002 Takeuchi et al.

FOREIGN PATENT DOCUMENTS

| EP | 1 116 590 | 7/2001 |
| JP | 07-081055 | 3/1995 |
| JP | 08052872 A * | 2/1996 |
| JP | 2873287 B1 | 1/1999 |
| WO | 96/14987 | 5/1996 |
| WO | WO 02/070265 A1 | 9/2002 |

* cited by examiner

*Primary Examiner*—Darren E. Schuberg
*Assistant Examiner*—J. San Martin
(74) *Attorney, Agent, or Firm*—Burr & Brown

(57) ABSTRACT

A piezoelectric actuator 1 capable of being driven with a high electric field intensity, obtaining a larger displacement and being high in electric conducting reliability of electrodes, and comprising: at least one cell 3 defined by two side walls 6, a substrate 2 and a ceiling wall 7; the two side walls being disposed on the substrate and being covered with the ceiling wall to define one cell, at least the two side walls 6 comprising piezoelectric/electrostrictive devices 4, and the piezoelectric/electrostrictive devices 4 being capable of changing a volume of the cell 3 by displacement of the walls. Each of the piezoelectric/electrostrictive devices 4 comprises a plurality of layered piezoelectric/electrostrictive bodies 14 and electrodes 18, 19 which are alternately stacked, and end portions of the electrodes 18, 19 are embedded in the piezoelectric/electrostrictive bodies 14 in at least the internal side of the cell 3.

7 Claims, 14 Drawing Sheets

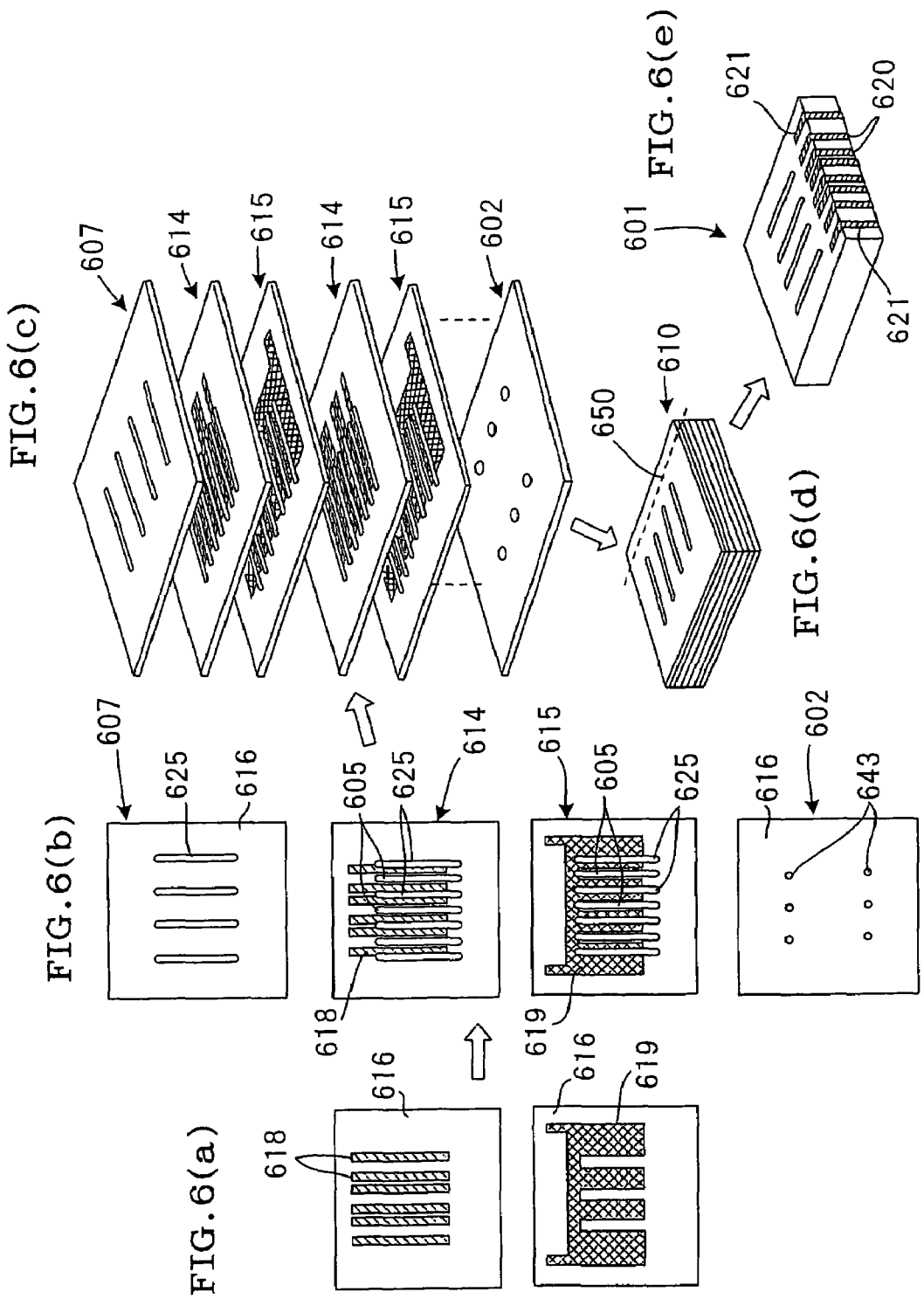

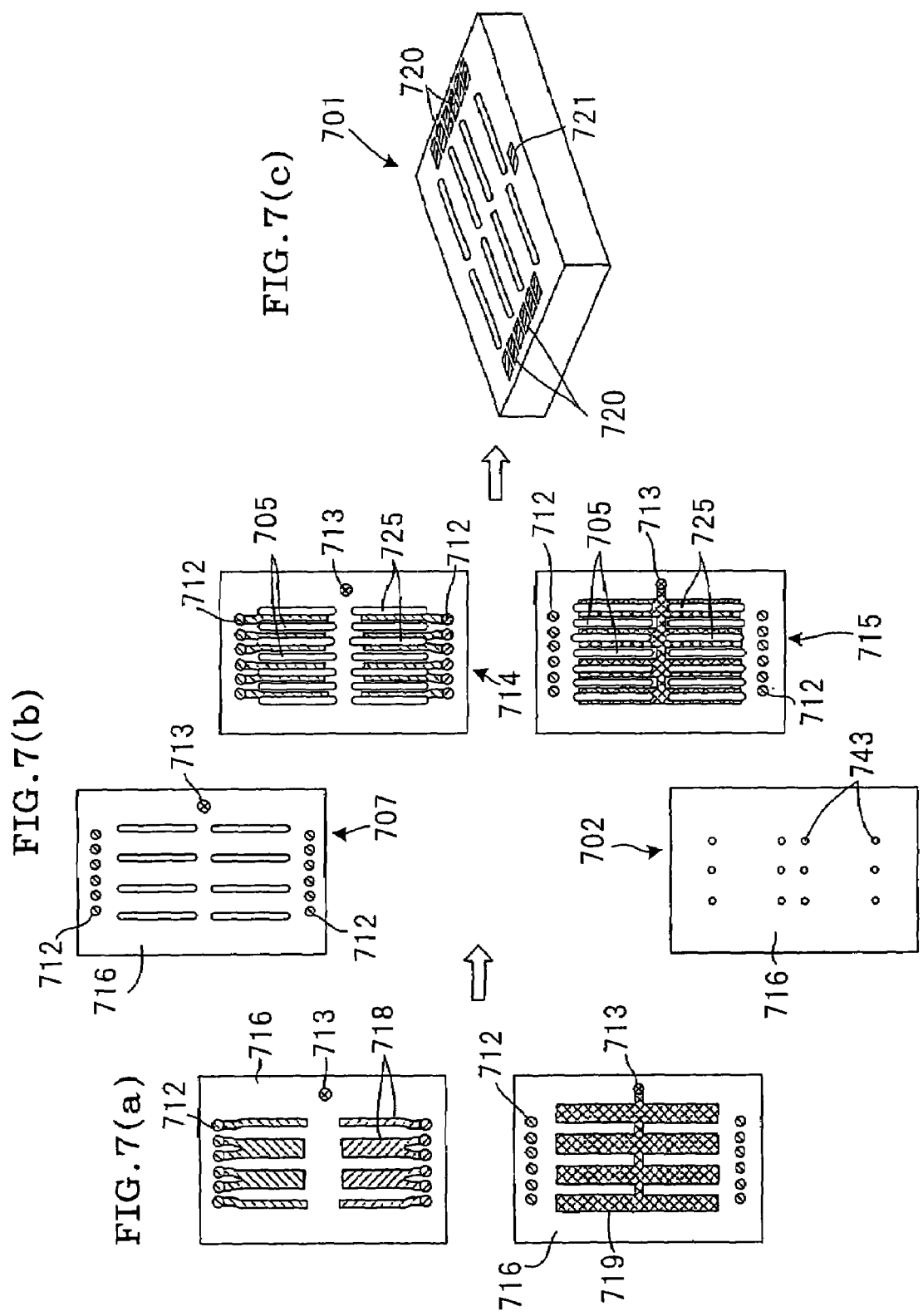

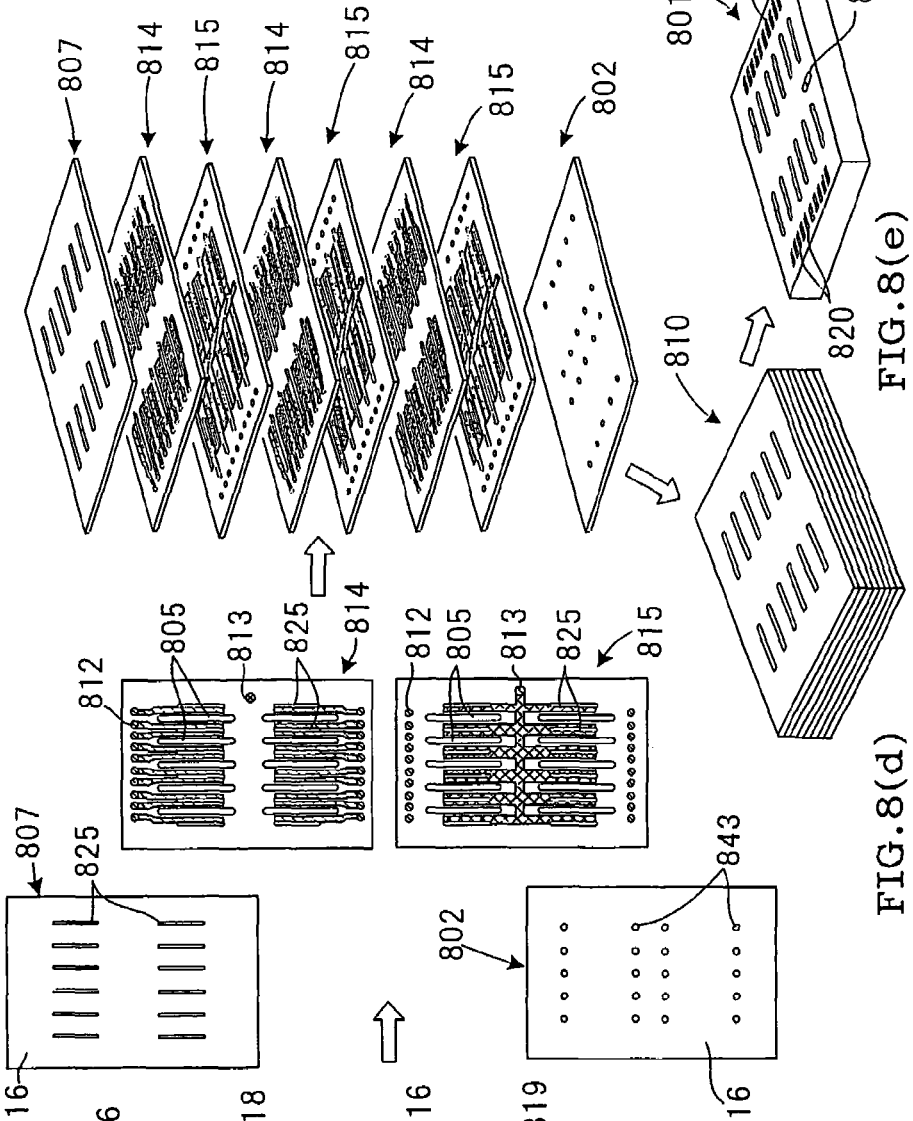

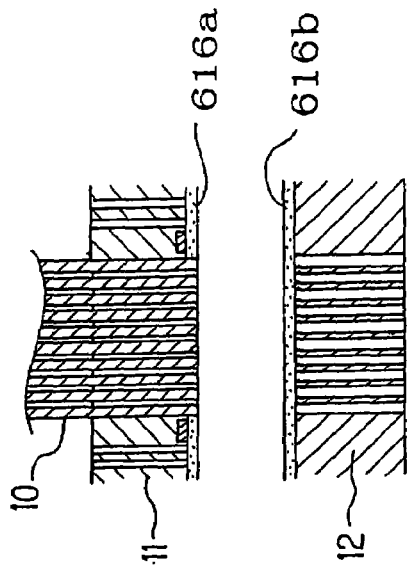
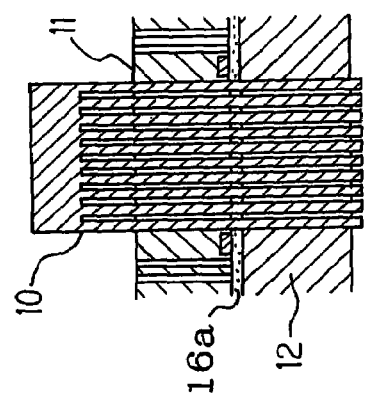
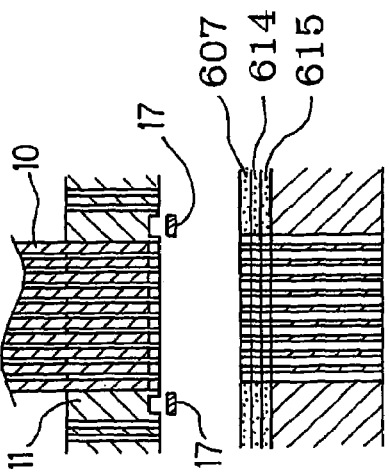
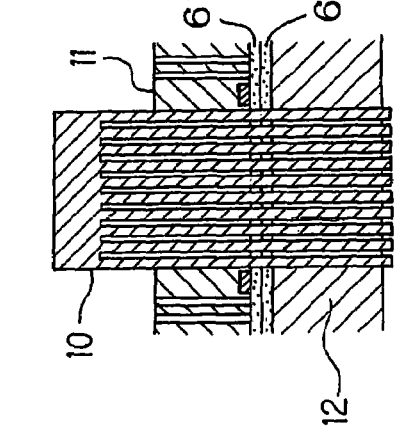

CELL DRIVING TYPE PIEZOELECTRIC/ELECTROSTRICTIVE ACTUATOR AND METHOD OF MANUFACTURING THE SAME

This application claims the benefit of Japanese Application 2003-155009, filed May 30, 2003, and Japanese Application 2004-154950, filed May 25, 2004, the entireties of which are incorporated herein by reference.

BACKGROUND OF THE INVENTION

1. Field of the Invention

The present invention relates to a cell driving type piezoelectric/electrostrictive actuator including at least one cell formed by a piezoelectric/electrostrictive device to realize a predetermined function by a volume change of the cell.

2. Description of the Related Art

A piezoelectric actuator driven by a share mode system has heretofore been known as the piezoelectric actuator. The share mode system refers to a driving system which causes displacement by a driving electric field in a direction crossing a polarized field direction of a piezoelectric body at right angles. One example of the piezoelectric actuator using such a driving system is shown in FIG. 16.

A piezoelectric actuator 71 shown in FIG. 16 is used in an ink jet head, a plurality of piezoelectric bodies which are comb teeth 76 or driving portions 74 are formed in the form of comb teeth 76 on a substrate 72, and slits 75 between the comb teeth 76 are closed by a lid plate 77 to form cells 73 having substantially rectangular parallelepiped shapes. When openings in comb teeth tips of the piezoelectric actuator 71 are closed by a nozzle plate 9 including nozzles 8, an ink jet head 70 using the cells 73 as ink chambers is obtained. Moreover, when a driving electric field is applied in a direction parallel to the polarized field direction of the comb teeth 76 which are formed of piezoelectric materials to constitute the driving portions 74, the comb teeth 76 are deformed, volumes of the cells 73 change, and ink stored in the cells 73 can be discharged.

The piezoelectric actuator 71 is prepared in the steps illustratively shown in FIGS. 17(a) to 17(e). First, a piezoelectric material 86 is prepared (FIG. 17(a)), and fired (shrunk to a certain extent as shown in FIG. 17(b)). Then, the polarization treatment is performed (FIG. 17(c)). In FIG. 17(d), fine slits are formed by working processing using a dicing saw or the like, and the driving portions 74 displaced by the driving electric field are sandwiched between the plurality of slits 75 is arranged in the form of the comb teeth to form electrodes 88 on the wall surfaces in the slits 75 as is shown in FIG. 17(e). Said slits are spaces in which the ink is stored. Thereafter, as shown in FIG. 16, the lid plate 77 made of a glass plate or the like is attached, and the openings in the comb teeth tips are covered with the nozzle plate 9 including the nozzles 8 to form the cells 73 to be charged with the ink.

Moreover, there is disclosed another type of an ink jet (recording) head of a piezoelectric type in Patent Document 1 (See Japanese Patent No. 2873287).

The ink jet (recording) head disclosed in Patent Document 1 is characterized in that ink channels (corresponding to the cells) and dummy channels are alternately formed being separated by side walls of piezoelectric bodies, electrodes formed in the respective ink channels are formed as a common electrode, electrodes formed in the respective dummy channels are used as individual electrodes, and the ink is prevented from contacting a passivation film formed on the individual electrode. An electric field is applied to the electrodes formed in the respective channels to change volumes in the ink channels, and ink droplets are discharged. According to Patent Document 1, by the above-described characteristics, the electric field does not act on the ink during the driving, and any electrolysis of the ink by a low electric insulation withstand voltage does not occur regardless of a defect or non-defect of the passivation film. Therefore, a life of the head is prolonged, there is not any possibility that physical properties of ink are changed during the driving the head, and it is therefore described that the actuator largely contributes a high printing quality.

Furthermore, the present inventors have proposed a piezoelectric actuator, which is different from the piezoelectric actuator shown in FIG. 16, in Patent Document 2 (See WO 02/070265 pamphlet).

The actuator disclosed in Patent Document 2 is a comb teeth type piezoelectric actuator, characterized in that a plurality of piezoelectric actuators comprising a plurality of piezoelectric layers are aligned/arranged in the form of the comb teeth, and the side surface of each comb tooth comprises an as-fired surface. As described in Patent Document 2, because of the above-described characteristics, the surface of the comb teeth type piezoelectric actuator is not easily contaminated, a short circuit defect or the like caused by sticking matters during the practical use does not easily occur, and the actuator is superior in durability and reliability.

However, the actuators disclosed in the above-mentioned Patent Documents have problems to be improved.

First, the conventional piezoelectric actuator 71 shown in FIG. 16 has a problem caused by the driving in the share mode system in which the driving electric field is generated in the direction crossing the polarized field direction at right angles. That is, since the actuator cannot be driven at such high electric field intensity that a polarization of the actuator is changed, a large electric field induced strain amount is not obtained. If a high driving electric field intensity is applied, the polarization of the actuator gradually changes during the driving, and eventually a drop of the strain amount is caused. Therefore, it has been difficult to obtain a large displacement in the actuator as long as the share mode system is used.

Moreover, during the manufacturing, since the electric field direction for polarization is different from an electric field direction for driving, the electrodes for use in the polarization treatment should be formed, and removed after the polarization treatment. This means that the formation of electrodes for driving is required thereafter. Accordingly, the number of forming steps increases, and the workloads become larger.

Additionally, in the ink jet (recording) head described in Patent Document 1, since the common and individual electrodes are formed on the side walls of the piezoelectric body, it is laborious to form the electrodes on the narrow spaces of the side walls with plating, sputtering or the like in order to cope with a demand for high densification of the ink jet (recording) head in recent years. This would often cause the lowering of the conducting reliability. When a conductive liquid is used as an ink, it is indispensable to form the passivation film in order to insulate the electrodes, and extra forming steps have been required. Furthermore, depending on the driving polarity, it is necessary to form the passivation film in order to prevent the electrolysis of the ink regardless of whether or not the ink has conductivity, and it has been difficult to reduce the number of steps required for the manufacturing.

For the comb teeth type piezoelectric actuator disclosed in Patent Document 2 by the present applicant, since it is not necessary to form the electrodes on the side walls by the plating, sputtering or the like, the conducting reliability of the electrode does not drop even in the arrangement in a high density. However, it is indispensable to form the passivation film in order to insulate the electrodes, and the extra forming steps have been required.

SUMMARY OF THE INVENTION

The present invention has been developed in consideration of the above-described prior-art problems. The present invention is directed to a piezoelectric actuator capable of being driven with high electric field intensity with a large displacement, and having a high conducting reliability of electrodes, and a method for manufacturing the same. The present piezoelectric actuator can be prepared with a less number of manufacturing steps, and it can be used regardless of the properties, composition thereof, and the like of ink. The present actuator can be used, for example, as an ink jet head. As a result of the intensive studies, it has been found that the problems can be solved by the cell driving type piezoelectric/electrostrictive actuator mentioned below in detail and a method for manufacturing the same.

That is, according to the present invention, there is provided a cell driving type piezoelectric/electrostrictive actuator comprising: at least one cell defined by two side walls, a substrate and a ceiling wall; said two side walls being disposed on the substrate, and being covered by the ceiling wall, at least the two side walls being composed of piezoelectric/electrostrictive devices; said piezoelectric/electrostrictive devices being capable of changing a volume of said at least one cell with causing displacement in walls of the cell, wherein each of piezoelectric/electrostrictive devices comprises a plurality of layered piezoelectric/electrostrictive bodies and electrode layers which are alternately stacked, and end portions of the electrodes are embedded in the piezoelectric/electrostrictive bodies at an internal side of the cell. Here, the internal side of the cell means the side of the wall portion defining the cell referred to and being defined by the piezoelectric/electrostrictive device including the end portion of the electrode together and the adjacent piezoelectric/electrostrictive device and the ceiling wall. The external side of the cell means a side of the space located at an opposite to the internal side of the cell.

The present actuator may preferably comprise a plurality of cells, each of the cells is formed independently of the adjacent cell, and the end portion of the electrodes of the piezoelectric/electrostrictive device forming one cell is preferably exposed from the piezoelectric/electrostrictive body at the external side of the cell. The ceiling wall to be used for connecting two side walls to define a cell is preferably formed of the piezoelectric/electrostrictive device. The term "independent cell" means that one cell does not share any constituting element for causing the displacement with the other cell. For example, each cell does not share the side wall comprising the piezoelectric/electrostrictive device with any adjacent cell. The expression "the external side of the cell" means an opposite side of the internal side of the cell and is a space facing to the adjacent cell when a plurality of independent cells is provided. One may employ, needless to say, the electrode structure according to the present invention in the cell arrangement in which one piezoelectric/electrostrictive device is shared by two adjacent cells; that is, the adjacent cells are not independent of each other.

Moreover, in the present invention, the electric connection in the portion(s) other than the two side walls comprising the piezoelectric/electrostrictive devices is preferably performed every other layer in a portion of the electrodes, and the electric connection is preferably performed by a through hole or a via hole.

According to the present invention, there is provided an optical switch which is disposed midway in an optical path and which defines a path of an optical signal, the optical switch comprising: an actuator section comprising the above-described cell driving type piezoelectric/electrostrictive actuator; and a waveguide section including a fine slit, wherein gas is charged in a cell of the actuator section, liquid is charged in the fine slit of the waveguide section, the cell is connected to the fine slit via a communicating hole, the fine slit (waveguide section) intersects with an optical waveguide in the fine slit, and the cell is disposed in an intersecting place. A volume of the cell is changed by displacement of the piezoelectric/electrostrictive device constituting the side walls of the cell, and a part of the gas to be charged in the cell in the intersecting place is injected protrudently into a fine slit from the communicating hole, or the gas injected protrudently into the fine slit is returned into the cell via the communicating hole, thereby a refractive index of the fine silt inclusive of the waveguide section is changed.

Furthermore, according to the present invention, there is provided a micro pump which feeds fluid by a function of pressure, comprising: at least one pump section, the pump section comprising a pump unit, the pump unit comprising at least one actuator section which causes a fluctuation of pressure and a flow path section in which the fluid flows, and the actuator section comprising the above-mentioned cell driving type piezoelectric/electrostrictive actuator. The change of the pressure is caused in the flow path section by displacement of a piezoelectric/electrostrictive device constituting the side walls of a cell of the actuator section to selectively form a flow path of the fluid.

Additionally, according to the present invention, there is provided a method of manufacturing a cell driving type piezoelectric/electrostrictive actuator comprising: at least one cell defined by two side walls, a substrate and a ceiling wall; said two side walls being disposed on the substrate, and being covered by the ceiling wall, at least the two side walls being composed of piezoelectric/electrostrictive devices; said piezoelectric/electrostrictive devices being capable of changing a volume of said at least one cell with causing displacement in walls of the cell, wherein each of piezoelectric/electrostrictive devices comprises a plurality of layered piezoelectric/electrostrictive bodies and electrode layers which are alternately stacked, and end portions of the electrodes are embedded in the piezoelectric/electrostrictive bodies at an internal side of the cell, the method comprising the steps of: preparing a predetermined number of ceramic green sheets containing a piezoelectric/electrostrictive material as a major component and being used for constituting the piezoelectric/electrostrictive bodies later, forming, on one surface of each ceramic green sheet, a filmy layer to be used as an electrode later and comprising a conductor material as a major component; disposing a plurality of slits in predetermined positions of each ceramic green sheet in such manner that at least the slits to be used for constituting the cell later does not contact the conductor material; alternately stacking and compression-bonding said predetermined number of ceramic green sheets having the electrodes formed of the conductor material and the slits to form a ceramic green laminated body having a plurality of slit-like through holes;

and firing to integrate the ceramic green laminated body to obtain a fired integrated body, wherein the method includes a step for forming the side walls which are constituted from wall portions between the plurality of slit-like through holes and each of cells by using some or all of each of the plurality of slit-like through holes. The term "filmy layer" or "film" in the present specification means a layer in the form of a film formable by the conventional film forming method such as lithography, and the like when this term is used to refer to the form of an electrode(s) or together with the word "an electrode(s)".

For the method of manufacturing the cell driving type piezoelectric/electrostrictive actuator according to the present invention, in the step of forming slits and the step of stacking a predetermined number of ceramic green sheets, one may use a punching mold having a punch and a die, and a stripper. When the punching mold is used, the slit forming step and stacking step will be carried out in the manner mentioned below. That is, the step comprises forming a first slit in a first ceramic green sheet among the plurality of ceramic green sheets having the film being formed of the conductor material by the punch; bringing the first ceramic green sheet in close contact with the stripper to lift up the first ceramic green sheet without removing the punch from the first slit; lifting up the punch to such an extent that a tip portion of the punch is slightly retracted from a lowermost portion of the lifted-up first ceramic green sheet; forming a second slit in a second ceramic green sheet among the plurality of ceramic green sheets on which the films are formed of the conductor materials by the punch; bringing the second ceramic green sheet via the first ceramic green sheet in close contact with the stripper to lift up the second ceramic green sheet in a state without removing the punch from the slits formed in the second sheet; and lifting up the punch to such an extent that the tip portion of the punch is slightly retracted from a lowermost portion of the lifted-up second ceramic green sheet. Then, the steps of forming the slits, bringing the sheet having slits via the formerly stacked green sheets into contact with the stripper and lifting the resultant sheets up to stack it to the lifted stacked sheets are repeated until a predetermined number of ceramic green sheets having the film being formed of the conductor material, while forming the slits to obtain a ceramic green laminated body including the slit-like through holes. A manufacturing method described in JP-A-2002-160195 may be used for the above-described operation, and it is possible to obtain a ceramic green sheet laminated body having little positional deviation among the layers.

BRIEF DESCRIPTION OF THE DRAWINGS

FIGS. 6($a$) to ($e$) show illustratively one example of a method for manufacturing the cell driving type piezoelectric/electrostrictive actuator according to the present invention;

FIGS. 7($a$) to ($c$) show illustratively another example of a method for manufacturing the cell driving type piezoelectric/electrostrictive actuator according to the present invention;

FIGS. 8($a$) to ($e$) show illustratively still another example of a method for manufacturing the cell driving type piezoelectric/electrostrictive actuator according to the present invention;

FIGS. 18($a$) to ($e$) are a drawing to show illustratively a simultaneous punching and stacking method which is one example of means for disposing a slit in a ceramic green sheet, FIG. 18(a) shows a first sheet preparation step in which a first ceramic green sheet is laid on a die, FIG. 18(b) shows a punching step of the first ceramic green sheet, FIG. 18(c) shows a second sheet preparation step in which a second ceramic green sheet is laid, FIG. 18(d) shows a punching step of the second ceramic green sheet, and FIG. 18(e) is a diagram showing a punching completion step of finishing punching and stacking of all the ceramic green sheets, and detaching the stacked ceramic green sheets by a stripper.

DESCRIPTION OF THE PREFERRED EMBODIMENTS

Embodiments of a cell driving type piezoelectric/electrostrictive actuator and a method for manufacturing the actuator according to the present invention will be concretely described hereinafter, but the present invention is not to be interpreted with limiting to these embodiments. Various changes, modifications, improvements, or replacements may be added based on knowledge of a person skilled in the art without departing from the scope of the present invention.

The cell driving type piezoelectric/electrostrictive actuator according to the present invention is often referred to by using the expression "piezoelectric/electrostrictive". However, the present actuator uses a strain induced by an electric field, and is not limited to a piezoelectric or electrostrictive actuator using a piezoelectric effect which generates a strain substantially proportional to the applied electric field, or an electrostrictive effect which generates the strain substantially proportional to a square of the applied electric field in a narrow sense. The present actuator may encompass also the one using the phenomena polarization reversal seen in a general ferroelectric material, and antiferroelectric phase-ferroelectric phase transition seen in an antiferroelectric material. In the cell driving type piezoelectric/electrostrictive actuator according to the present invention, a ceramic actuator superior in mechanical strength is more preferable. It is appropriately determined whether or not to perform a process concerning polarization based on properties of the material for use in a piezoelectric/electrostrictive body of a piezoelectric/electrostrictive device constituting the piezoelectric/electrostrictive actuator according to the present invention.

Moreover, in the present specification, the expression "vertical direction" indicates a direction vertical to the surface of the substrate, and means relative up/down on a substrate side which is down (direction) with respect to the cell, and the down (direction) does not mean a gravity direction. Furthermore, the expression "driving of the actuator" means the driving of at least one cell, and the one "driving of the cell" means that displacement is caused in the piezoelectric/electrostrictive device defining the cell, and the volume change of the cell is caused to keep the cell in a compressed or decompressed state.

Figure 1A:
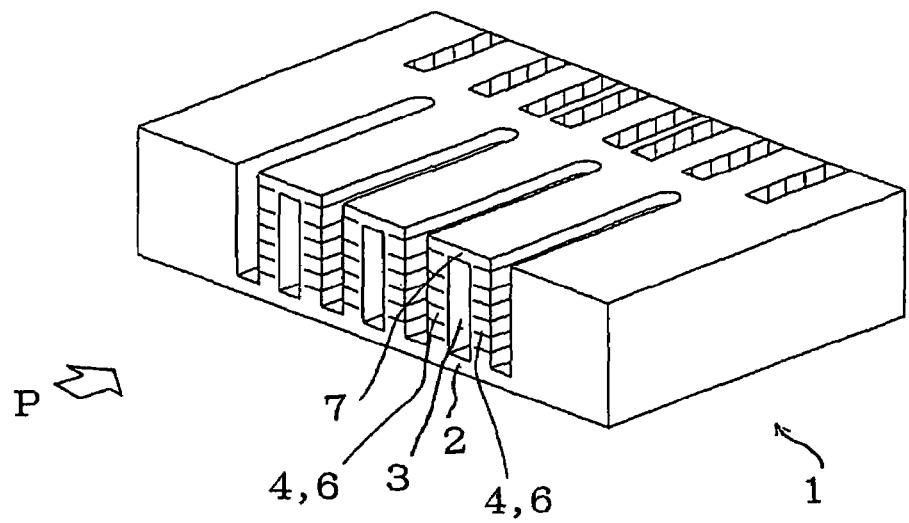
FIG. 1($a$) is a perspective view showing one embodiment of a cell driving type piezoelectric/electrostrictive actuator according to the present invention, and FIG. 1($b$) is a perspective view of a fluid feeding device which is an application example.
Figure 2:
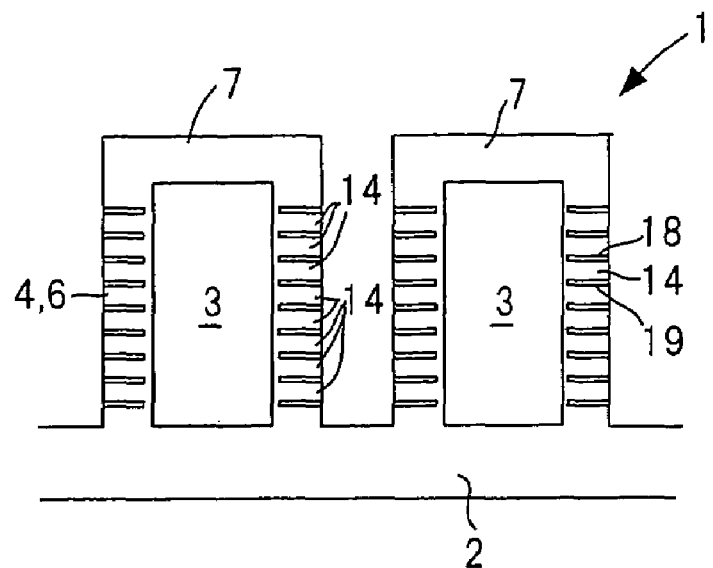
FIG. 2 is a side view showing one embodiment of the cell driving type piezoelectric/electrostrictive actuator according to the present invention, and a side view of a P view part in FIG. 1($a$)

The present invention will be described with reference to the drawings. FIG. 1(a) is a perspective view showing one embodiment of a cell driving type piezoelectric/electrostrictive actuator according to the present invention, and FIG. 2 is a side view of a P view part in FIG. 1(a). For a shown cell driving type piezoelectric/electrostrictive actuator 1, side walls 6 which are driving portions being composed of piezoelectric/electrostrictive devices 4 are aligned/arranged on a substrate 2, and two adjacent side walls 6 are connected to a ceiling wall 7 to form a plurality of cells 3 having a substantially rectangular parallelepiped shape. The cell driving type piezoelectric/electrostrictive actuator 1 is an actuator of a type (edge type) in which the side surface of the cell 3 in a transversal (short) direction is opened.

Figure 1B:
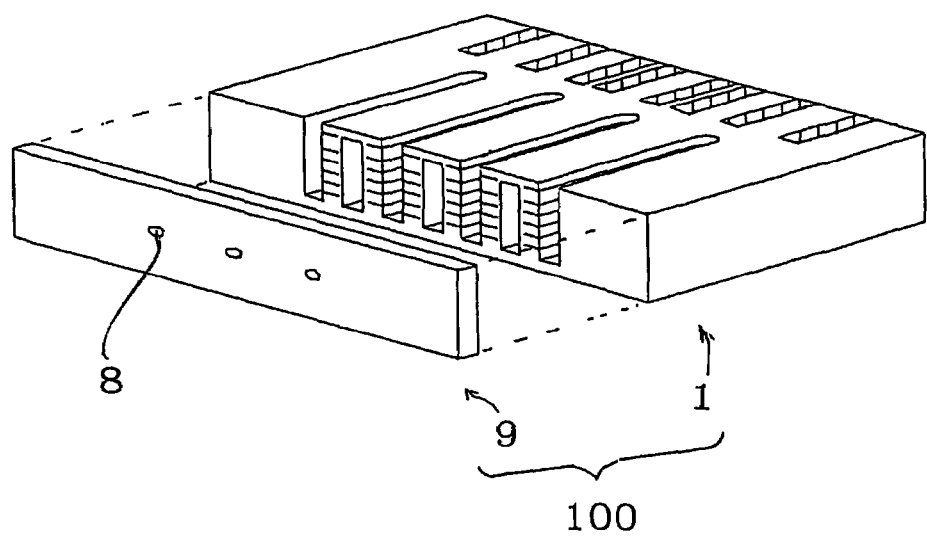

For example, as shown in FIG. 1(b), a fluid feeding device 100 can be obtained by covering the cells 3 of a cell driving type piezoelectric/electrostrictive actuator 1 of the edge type with a nozzle plate 9 having nozzles 8. In the fluid feeding device 100, the cell 3 is used as a fluid pressurizing chamber. When a driving electric field is applied to the side wall 6 comprising the piezoelectric/electrostrictive device 4 of the actuator in the same direction as a polarized field direction thereof, the side wall contracts/expands in the vertical direction to change the volume of the cell 3, thereby a liquid charged in the cell 3 can be fed out. The fluid feeding device 100 is applicable, for example, to a head of an ink jet printer, a mixture/reaction operation of a micro amount of solution in a biotechnology field, the manufacturing of DNA chips required for analyzing a genetic structure, a micro droplet discharge device for use in a coating step for manufacturing a semiconductor, a micro injecting device for discharging a small amount of a reagent(s) in the various testing methods in the medical field, and the like. It is to be noted that in this figure, the electrodes of the cell contacting the nozzle plate 9 including the nozzles 8 is exposed, but is preferably embedded because a short-circuit between the electrodes by dust or the like is not easily caused.

The cell driving type piezoelectric/electrostrictive actuator 1 according to the present invention is characterized in that, as shown in FIG. 2, a plurality of laminar piezoelectric/electrostrictive bodies 14 and electrode layers 18, 19 are alternately stacked in the piezoelectric/electrostrictive devices 4 constituting the side walls 6, and end portions of the electrodes 18, 19 are embedded in the piezoelectric/electrostrictive bodies 14 on the internal side of the cell 3 formed by the piezoelectric/electrostrictive devices 4 comprising the bodies themselves. By the above-described characteristics, it is not necessary to form the electrodes on the side wall of the piezoelectric/electrostrictive body as in the ink jet (recording) head described in Patent Document 1, and a drop in electric conducting reliability of the electrode is not caused even in high-density arrangement. As a result of the above-described characteristics, the surface contacting the fluid charged in the cell 3 is usually constituted of the piezoelectric/electrostrictive body such as ceramic which is chemically remarkably stable, and the fluid for use is hardly restricted. Furthermore, since the electrodes 18, 19 do not contact the fluid charged in the cell 3, it is unnecessary to form a passivation film for insulating the electrode regardless of the fluid for use, and manufacturing steps can largely be reduced.

The cell driving type piezoelectric/electrostrictive actuator 1 includes eight layered piezoelectric/electrostrictive bodies 14 for each piezoelectric/electrostrictive device 4 constituting the side wall 6. In the cell driving type piezoelectric/electrostrictive actuator according to the present invention, the number of layers is appropriately determined in accordance with application field and the purpose of use, and a preferable number of piezoelectric/electrostrictive layers is 2 to 100 in consideration of stability of actuator characteristics and ease of manufacturing.

In the cell driving type piezoelectric/electrostrictive actuator 1, the piezoelectric/electrostrictive body 14 constituting the piezoelectric/electrostrictive device 4 is polarized, for example, in a direction toward the electrode 19 from the electrode 18 (vertical direction in FIG. 2) (polarization direction differs with each layer by the electrodes sandwiched). Moreover, a power supply is connected to a electrode terminal (not shown), and a voltage is applied between the electrodes 18, 19 while an electrode 18 side is positive, and an electrode 19 side is negative. Accordingly, an electric field in the same direction as the above-described polarization direction is formed.

In other words, for the cell driving type piezoelectric/electrostrictive actuator 1, the layered piezoelectric/electrostrictive bodies 14 whose polarizations are in mutually opposite directions hold the electrodes 18, 19, and are stacked, and the direction of the polarization is the same as that of the driving electric field in each piezoelectric/electrostrictive body 14. As a result, an electric field induced strain is developed in the piezoelectric/electrostrictive body 14, and the piezoelectric/electrostrictive device 4 tries to contract/expand substantially in the vertical direction (vertical to the substrate 2) in FIG. 2 in a portion of the piezoelectric/electrostrictive body 14 sandwiched between the electrodes 18, 19 based on displacement by a longitudinal effect. Since the electric field induced strain is directly used in the displacement of the piezoelectric/electrostrictive body 14, a generation force is large and response is high. The displacement developed by each layer is not large, but the displacement is proportional to the number of layers of piezoelectric/electrostrictive bodies, more exactly the number of sets including the piezoelectric/electrostrictive layers and a pairing number of electrode layers, and it is therefore possible to obtain a large displacement with the increase of a total number of the layers.

On the other hand, in the cell driving type piezoelectric/electrostrictive actuator 1, when the thickness of the piezoelectric/electrostrictive body 14 per layer is set to preferably 100 μm or less, more preferably 10 to 80 μm, the driving is also possible at a lower voltage.

Figure 16:
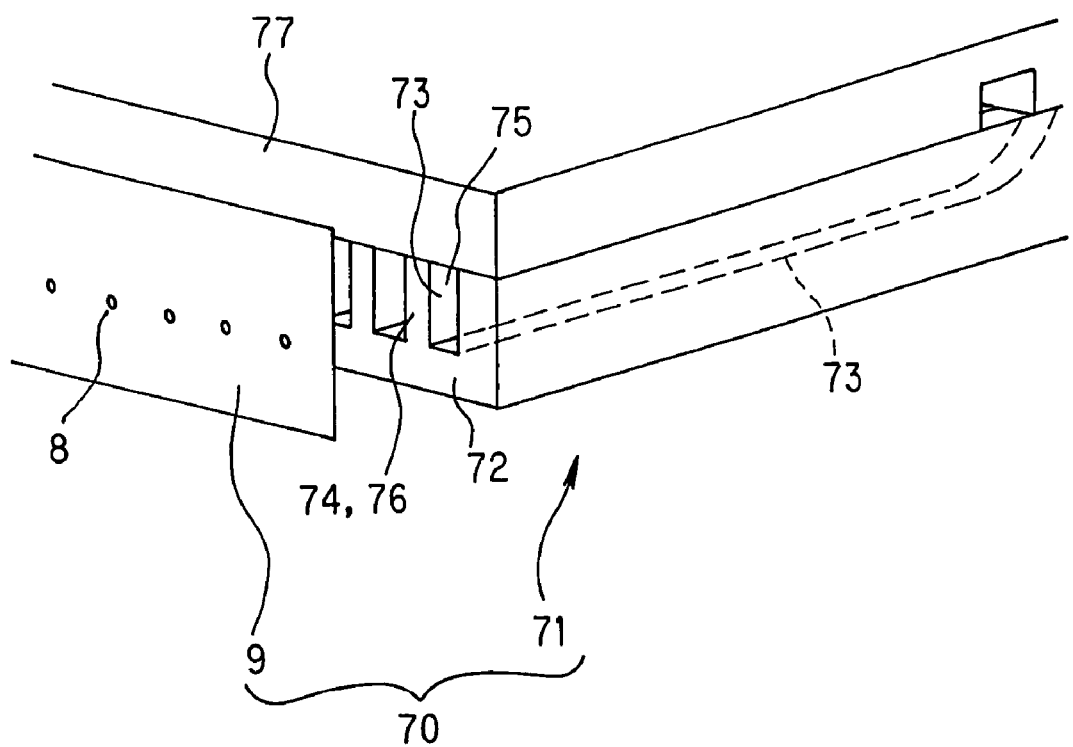
FIG. 16 is a perspective view showing one example of an ink jet head in which a conventional piezoelectric/electrostrictive actuator is used.
Figure 17C:
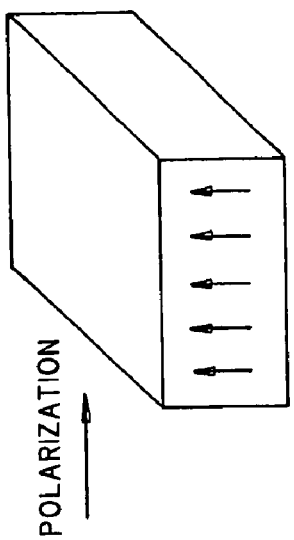
FIGS. 17($a$) to ($e$) are a drawing to show illustratively one example of a method for manufacturing the conventional piezoelectric/electrostrictive actuator.
Figure 17B:
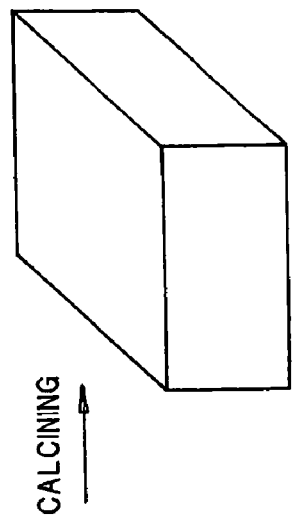
Figure 17A:
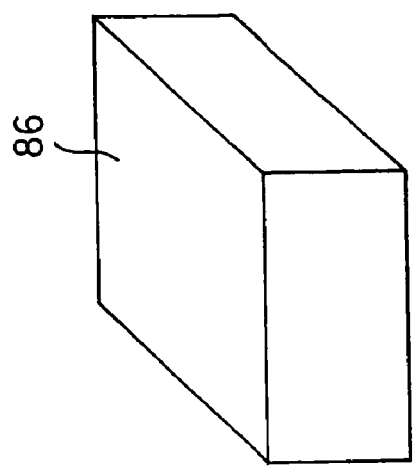
Figure 17D:
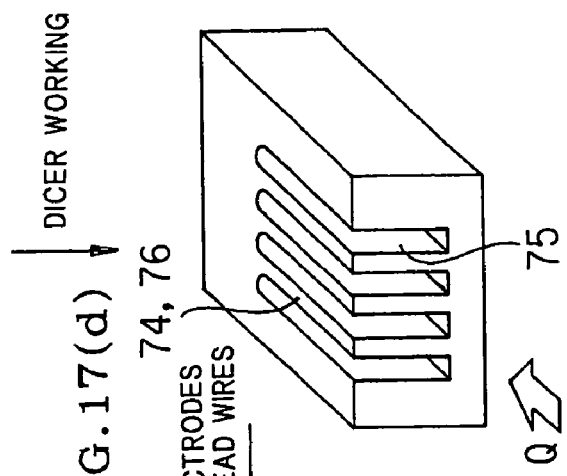
Figure 17E:
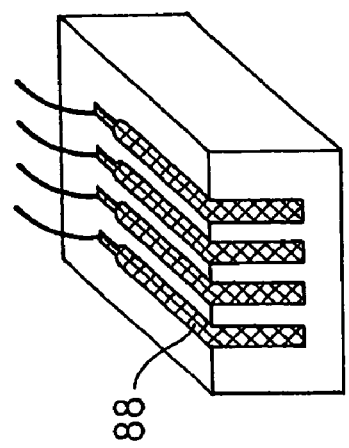

Additionally, in the cell driving type piezoelectric/electrostrictive actuator 1, each of the plurality of cells 3 is formed independently of the adjacent cell 3. In a conventional piezoelectric actuator 71 shown in FIG. 16, cells 73 adjacent to each other share comb teeth 76 (driving portions 74) comprising piezoelectric bodies, therefore the cells 73 cannot be individually driven completely independently of the other cells 73, and it is impossible to operate the cells 73 adjacent to each other in the same manner. Since a substrate 72 and lid plate 77 are shared, the displacement is restricted. However, in the cell driving type piezoelectric/electrostrictive actuator 1 shown in FIG. 2, one cell 3 does not share the side wall 6 (piezoelectric/electrostrictive device 4) with the other cell 3, since the substrate 2 is shared between the respective cells, but the ceiling wall 7 is separated between the respective cells. Therefore, the driving of the cell 3 is performed independently of that of the adjacent cell 3, and the displacement is hardly restricted. It is possible to allow two adjacent cells 3 to perform the same or different operations. Therefore, for example, one may attain the same displacement with less field intensity, compared with the conventional actuator.

For example, when the cell driving type piezoelectric/electrostrictive actuator 1 is used as the fluid feeding device 100 described above with reference to FIG. 1(*b*), the fluid can be fed out simultaneously from the adjacent cells 3, therefore the number of driving operations of the cell 3 is smaller than before, and a fluid feeding speed is enhanced. More concretely, when the fluid feeding device 100 is used in production of DNA chips, a manufacturing cost can further be reduced.

Moreover, in the cell driving type piezoelectric/electrostrictive actuator 1, as described above, the end portions of the electrodes 18, 19 are embedded in the piezoelectric/electrostrictive bodies 14 on the cell 3 side formed by the piezoelectric/electrostrictive devices 4 comprising the electrodes themselves, but are exposed from the piezoelectric/electrostrictive bodies 14 on the space facing to the adjacent cell 3 on the opposite side. Therefore, as described above, the piezoelectric/electrostrictive device 4 tries to contract/expand substantially in the vertical direction in FIG. 2 in the portion of the piezoelectric/electrostrictive body 14 sandwiched between the electrodes 18, 19, that is, the portion excluding the vicinity of a surface layer on the cell 3 side. However, the end portions of the electrodes 18, 19 are embedded in the piezoelectric/electrostrictive bodies 14 on the internal side of the cell 3. Here, the piezoelectric/electrostrictive body 14 is not sandwiched between the electrodes 18, 19, the electric field applied to the piezoelectric/electrostrictive body 14 partially becomes weak, therefore in actual, the piezoelectric/electrostrictive device 4 bends while contracting/expanding. Thus, one may make the volume change of the cell 3 larger.

Furthermore, when the piezoelectric/electrostrictive body is required to be subjected to the polarization, the polarization field of the piezoelectric/electrostrictive body is in the same direction as that of the driving electric field, it is therefore unnecessary to prepare a temporary electrode for polarization or to apply the electric field in the manufacturing steps, and throughput is enhanced. It is also possible to apply a manufacturing process involving heating at a temperature which is not less than Curie temperature regardless of the polarization. Therefore, for example, during fixing/connecting on a circuit substrate, soldering by solder reflow or the like, or thermosetting type adhesion can be performed. The throughput is further enhanced including the manufacturing steps of a product to which the actuator is applied, and a manufacturing cost is reduced. Moreover, a polarized state does not change even during the driving at a high electric field intensity, a more preferable polarized state is rather obtained, and a high strain can be stably obtained. Therefore, preferably the product can be further compact.

Furthermore, the volume change of the cell 3 is brought, and the pressure is generated by the deformation corresponding to contraction/expansion of the side wall 6 which is the piezoelectric/electrostrictive device 4 wherein a plural number each of piezoelectric/electrostrictive layers and electrode layers is alternately laminated. Therefore, it is unnecessary to make the thickness of the side walls while make the piezoelectric/electrostrictive body 14 thin in order to obtain the large displacement with a relatively lower voltage. Therefore, since rigidity does not drop, a problem that response becomes dull does not occur. That is, large displacement is not opposed to high-speed response, and both can be established.

The cell driving type piezoelectric/electrostrictive actuator 1 shown in FIGS. 1(*a*) and 2 has been described above. In the cell driving type piezoelectric/electrostrictive actuator according to the present invention including this actuator, the degree of profile of the surface of the cell is preferably approximately 8 μm or less. A concave/convex amount of the surface of the side wall (piezoelectric/electrostrictive device) forming the cell is preferably approximately 10 μm or less. Furthermore, a surface roughness Rt of the surface of the side wall (piezoelectric/electrostrictive device) forming the cell is preferably approximately 10 μm or less. Among these, with the actuator which satisfies at least any one condition, since the surface of the side wall constituted of the piezoelectric/electrostrictive device causing the displacement is smooth, electric field or stress is not easily concentrated at a displacing time, and a stable operation can be realized in each cell. Moreover, the preciseness in the direction of the displacement can be enhanced by making further the degree of profile of surfaces smaller.

It is to be noted that the degree of profile of surfaces is described in Japanese Industrial Standards B0621 "Definition and Indication of Geometric Deviation". The contour of the surface is a designated surface such that the surface has a determined functional shape, and the degree of profile of surfaces indicates a deviation of the contour of the surface from a geometric contour determined by a theoretically precise dimension.

Moreover, the surface roughness mentioned in the present invention means a surface roughness by JIS B0601 "Surface Roughness-Definition and Indication", and the surface roughness Rt is equal to a maximum height Rmax defined by a difference between a maximum point and a minimum point in a measurement surface.

Furthermore, in the cell driving type piezoelectric/electrostrictive actuator according to the present invention, a ratio of a shortest distance (referred to as a cell width) between the side walls forming one cell to a shortest distance (referred to as a cell height) between the substrate and the ceiling wall is preferably approximately 1:2 to 1:50, and the cell width is preferably approximately 60 μm or less. Said ratio of the cell width to the cell height is often referred to hereafter as an aspect ratio of the cell. More preferably, the aspect ratio of the cell is 1:10 to 1:30, and the cell width is 50 μm or less. With the actuator satisfying at least any one condition, further preferably with the actuator satisfying both the conditions, that is, with a thin and tall actuator, an output of the actuator is easily raised, high densification is achieved, and further compact actuator can be realized.

Moreover, in the cell driving type piezoelectric/electrostrictive actuator according to the present invention, a ratio of a distance (referred to as a cell interval) between one cell and the other adjacent cell to the cell height is preferably approximately 1:2 to 1:50, and the cell interval is preferably approximately 60 μm or less. More preferably, the ratio of the cell interval to the cell height is 1:10 to 1:25, and the cell interval is 50 μm or less. With the actuator satisfying at least any one condition, further preferably with the actuator satisfying both the conditions, one actuator can be obtained including more cells while one cell is independent of the other adjacent cell, and further compact actuator can be realized. When this actuator is used as the fluid feeding device 100 shown, for example, in FIG. 1(b), the fluid can be fed out simultaneously from the adjacent cells 3, and it is possible to feed out the fluid at a higher density as compared with the actuator including a structure in which one side wall serves as the side walls of two cells.

Figures 3A, 3B:
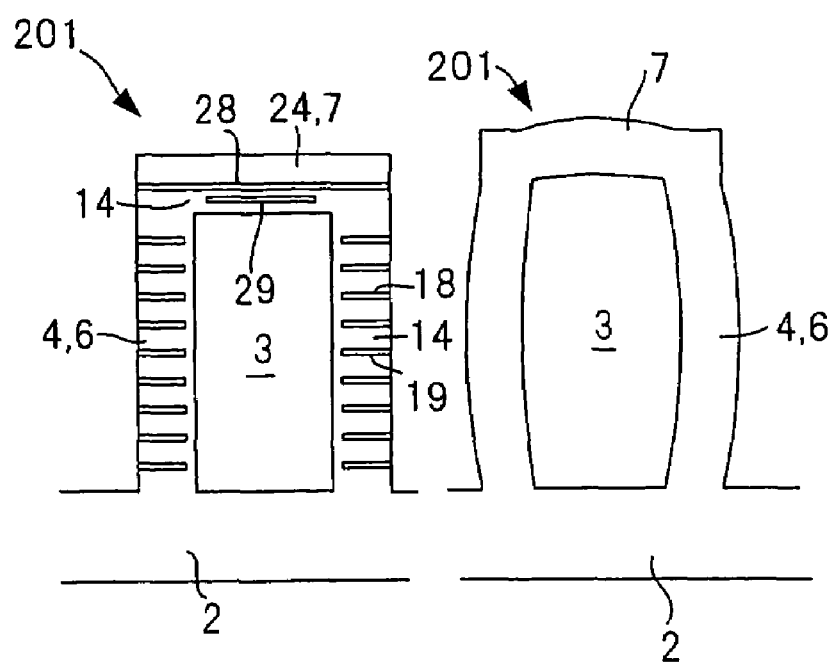
FIGS. 3($a$) and ($b$) show illustratively a cross sectional view of another embodiment of the cell driving type piezoelectric/electrostrictive actuator according to the present invention, FIG. 3($a$) shows a non-activated state, and FIG. 3($b$) shows an activated state.

Next, another embodiment of the cell driving type piezoelectric/electrostrictive actuator according to the present invention will be described. FIG. 3(a) is a cross sectional view showing another embodiment of the cell driving type piezoelectric/electrostrictive actuator according to the present invention. For a shown cell driving type piezoelectric/electrostrictive actuator 201, side walls 6 comprising piezoelectric/electrostrictive devices 4 are aligned/arranged on a substrate 2, and two adjacent side walls 6 are connected to a ceiling wall 7 to form a plurality of cells 3 having a substantially rectangular parallelepiped shape. The actuator is similar to the cell driving type piezoelectric/electrostrictive actuator 1 in that each of a plurality of cells 3 is independent of the adjacent cell 3, and the end portions of electrodes 18, 19 of the piezoelectric/electrostrictive device 4 constituting one cell 3 are embedded in the piezoelectric/electrostrictive bodies 14 on the internal side of the cell 3 of the electrode, whereas the other end portion thereof is exposed from the piezoelectric/electrostrictive body 14 on the external side of the adjacent cell facing to the space.

Additionally, for the cell driving type piezoelectric/electrostrictive actuator 201, the ceiling wall 7 comprises a piezoelectric/electrostrictive device 24 in which one piezoelectric/electrostrictive body 14 is sandwiched between electrodes 28, 29, and it is possible to use the displacement of the ceiling wall 7 (piezoelectric/electrostrictive device). FIG. 3(b) is a diagram showing the driving of the cell driving type piezoelectric/electrostrictive actuator 201. The actuator is superior to the cell driving type piezoelectric/electrostrictive actuator 1 in that, as shown, two side walls 6 bend while expanding, further the ceiling wall 7 bends, and the volume change of the cell 3 can therefore be further enlarged.

Figure 4:
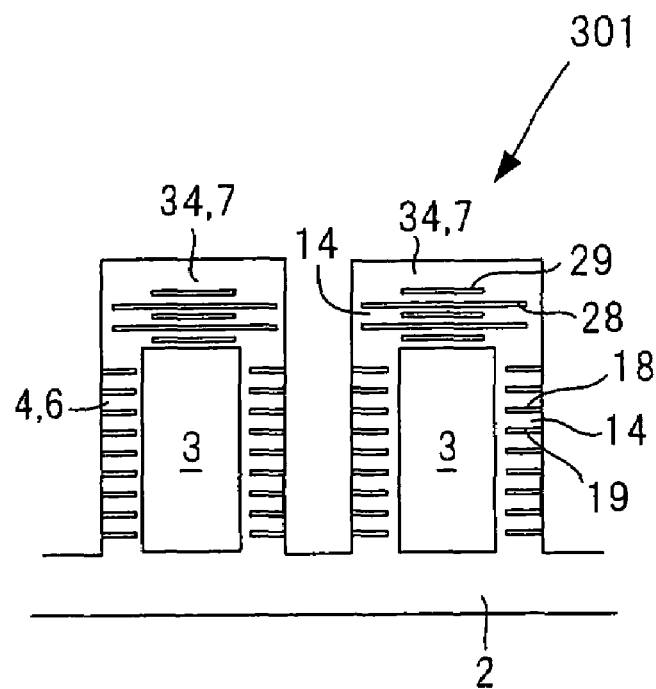
FIG. 4 is a cross sectional view showing still another embodiment of the cell driving type piezoelectric/electrostrictive actuator according to the present invention.

FIG. 4 is a cross sectional view showing still another embodiment of the cell driving type piezoelectric/electrostrictive actuator according to the present invention. A shown cell driving type piezoelectric/electrostrictive actuator 301 forms substantially the same configuration as that of the cell driving type piezoelectric/electrostrictive actuator 201. The actuator is superior to the cell driving type piezoelectric/electrostrictive actuator 201 in that a piezoelectric/electrostrictive device 34 constituting the ceiling wall 7 comprises a plurality of stacked piezoelectric/electrostrictive bodies 14 and electrodes 28, 29, and that the displacement of the ceiling wall 7 (piezoelectric/electrostrictive device) can further be enlarged.

Figure 5:
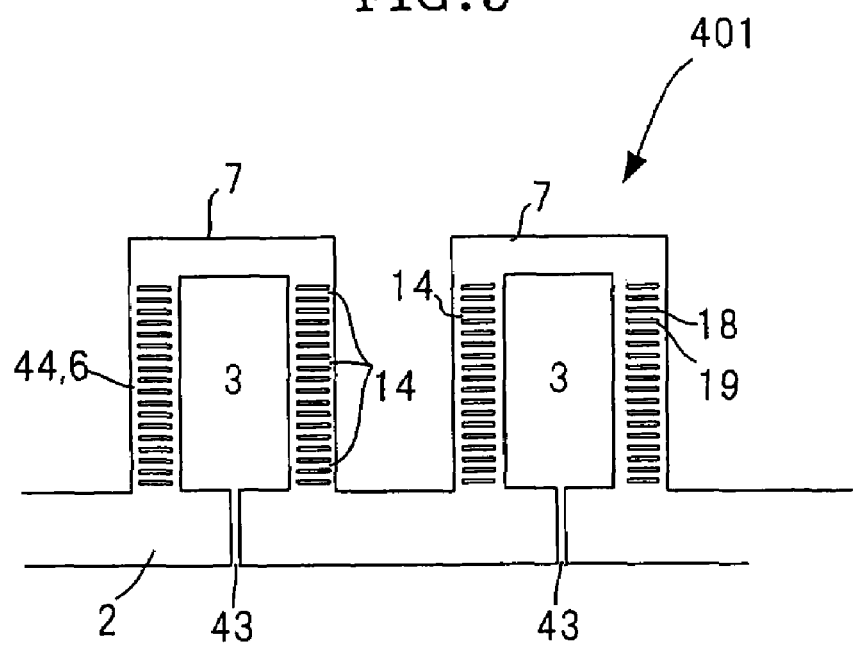
FIG. 5 is a cross sectional view showing still another embodiment of the cell driving type piezoelectric/electrostrictive actuator according to the present invention.

Next, FIG. 5 is a cross sectional view showing still another embodiment of the cell driving type piezoelectric/electrostrictive actuator according to the present invention. A shown cell driving type piezoelectric/electrostrictive actuator 401 conforms to the cell driving type piezoelectric/electrostrictive actuator 1 shown in FIG. 2 in that side walls 6 comprising piezoelectric/electrostrictive devices are aligned/arranged on a substrate 2, and two adjacent side walls 6 are connected to a ceiling wall 7 to form a plurality of cells 3 having substantially rectangular parallelepiped shapes, and each of the plurality of cells 3 is independent of the adjacent cell 3.

The cell driving type piezoelectric/electrostrictive actuator 401 is different from the cell driving type piezoelectric/electrostrictive actuator 1 in that the end portions of electrodes 18, 19 of a piezoelectric/electrostrictive device 44 constituting one cell 3 are embedded in the piezoelectric/electrostrictive bodies 14 both on the internal side of the cell 3 and the external side of cell 3. In this configuration, since the piezoelectric/electrostrictive body 14 is not sandwiched between the electrodes 18, 19 in the vicinity of opposite surface layers of the side wall 6, the electric field to be applied to the piezoelectric/electrostrictive body 14 in the portion may be weakened, and the displacement of the side wall 6 (piezoelectric/electrostrictive device 4) may be decreased. On the other hand, the electrodes 18, 19 do not appear on the outer surface of the side wall 6 (piezoelectric/electrostrictive device 44), and a common electrode (not shown) is not allowed to appear on at least the outer surface of the side wall 6. Accordingly, the conductive member appearing on the outer surface of the side wall can be eliminated. Even in the arrangement of cells having larger aspect ratios in a higher density, an actuator in which a short-circuit defect or the like is not easily occurred and which has a high reliability can be obtained. It is to be noted that the displacement can be compensated by the number of layers of the piezoelectric/electrostrictive bodies 14. The cell driving type piezoelectric/electrostrictive actuator 401 includes 17 layers of piezoelectric/electrostrictive bodies 14 for each piezoelectric/electrostrictive device 44 constituting the side wall 6, and the number of layers is larger than that of the cell driving type piezoelectric/electrostrictive actuator 1. In the cell driving type piezoelectric/electrostrictive actuator 401, a communicating hole 43 extending through the substrate 2 is formed, and this hole facilitates removing of a binder at a firing time for integration of the laminated body in the method for manufacturing a cell driving type piezoelectric/electrostrictive actuator according to the present invention of which detail will be described later in the present specification, or serves as a liquid discharge or outlet port from the cell, but is not peculiar to the cell driving type piezoelectric/electrostrictive actuator 401, and this configuration can be used even in the cell driving type piezoelectric/electrostrictive actuators 1, 201, 301 in accordance with the application.

The cell driving type piezoelectric/electrostrictive actuator according to the present invention will be described hereinafter in accordance with application examples with reference to the drawings. It is also possible to use the cell driving type piezoelectric/electrostrictive actuator according to the present invention as an actuator for the above-described fluid feeding device, additionally, for example, an optical switch for use in an optical communication network to switch a waveguide of an optical signal, an apparatus to be embedded in body to inject a micro amount of medicine, a micro pump applicable to a micro chemical analysis device or the like.

Figure 9A:
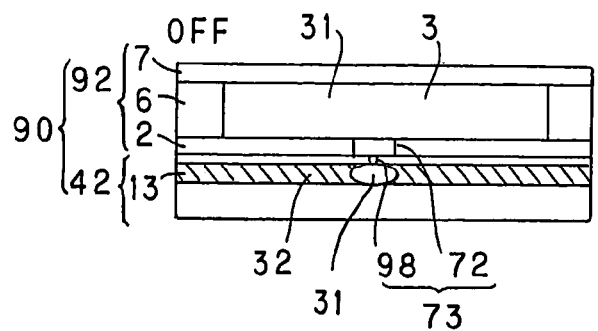
FIGS. 9($a$) and ($b$) show a sectional view of another application example of the cell driving type piezoelectric/electrostrictive actuator according to the present invention, FIG. 9($a$) shows a vertical cross section in a longitudinal direction of the cell of an optical switch which is an application example, and FIG. 9($b$) shows a vertical cross section in a transversal direction of the cell of the optical switch.
Figure 9B:
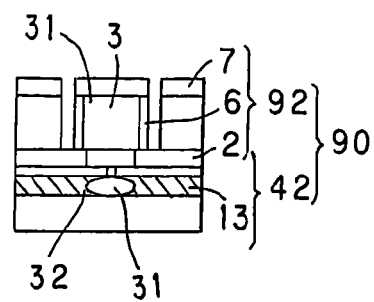
Figure 10A:
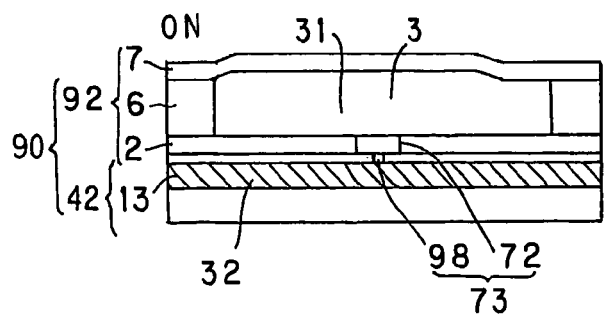
FIG. 10($a$) is a diagram showing an activated state of the optical switch shown in FIG. 9($a$), and FIG. 10($b$) is a diagram showing the activated state of the optical switch shown in FIG. 9($b$)
Figure 10B:
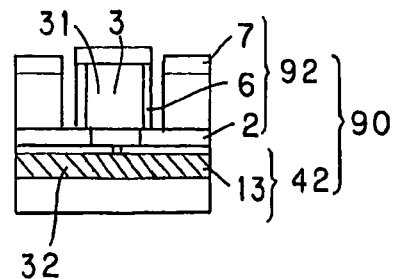

FIGS. 9(a), 9(b) and FIGS. 10(a), 10(b) are cross sectional views showing one embodiment of the optical switch to which the cell driving type piezoelectric/electrostrictive actuator according to the present invention is applied. FIG. 9(a) is a vertical cross sectional view in a longitudinal direction of the cell 3 of an optical switch 90, FIG. 9(b) is a vertical cross sectional view in a transversal (short) direction of the cell 3 of the optical switch 90, and FIGS. 10(a), 10(b) show activated states.

In the optical switch 90, the cell driving type piezoelectric/electrostrictive actuator according to the present invention is used as an actuator section 92. The optical switch 90 comprises the actuator section 92 in which the cell 3 is formed, and a waveguide section 42 including a micro slit 13, and a gas 31 is charged in the cell 3. The micro slit 13 is filled with a liquid 32 having insolubility to the gas 31. Moreover, the cell 3 in the actuator section 92 communicates with the micro slit 13 in the waveguide section 42 via a communicating hole 73 in which a communication opening 72 of the actuator section 92 is connected to a nozzle 98 of the waveguide section 42.

For the optical switch 90, the side wall 6 comprising the piezoelectric/electrostrictive device is contracted/expanded to change the volume of the cell 3, and the gas 31 charged in the cell 3 of the actuator section 92 may be injected protrudently into the micro slit 13 from the communicating hole 73. Moreover, the optical switch 90 is constituted in such a manner that the optical waveguide intersects with a place where the gas 31 in the micro slit 13 is protruded. When the liquid 32 or the gas 31 exists in the micro slit 13 in the intersecting place, an optical transmission line can be switched. A refractive index of the liquid 32 charged in the micro slit 13 intersecting with the optical waveguide is adjusted to be substantially equal to that of the optical waveguide. When the liquid 32 is present in the micro slit 13 in the intersecting place, the optical signal sent into the optical waveguide travels straight in an interface between the liquid 32 and the optical waveguide in the intersecting place. On the other hand, when the gas 31 is present in the micro slit 13 of the intersecting place, the optical signal sent into the optical waveguide is reflected by the interface between the gas 31 and the optical waveguide, and is refracted to travel in another optical waveguide installed beforehand.

Figure 11A:
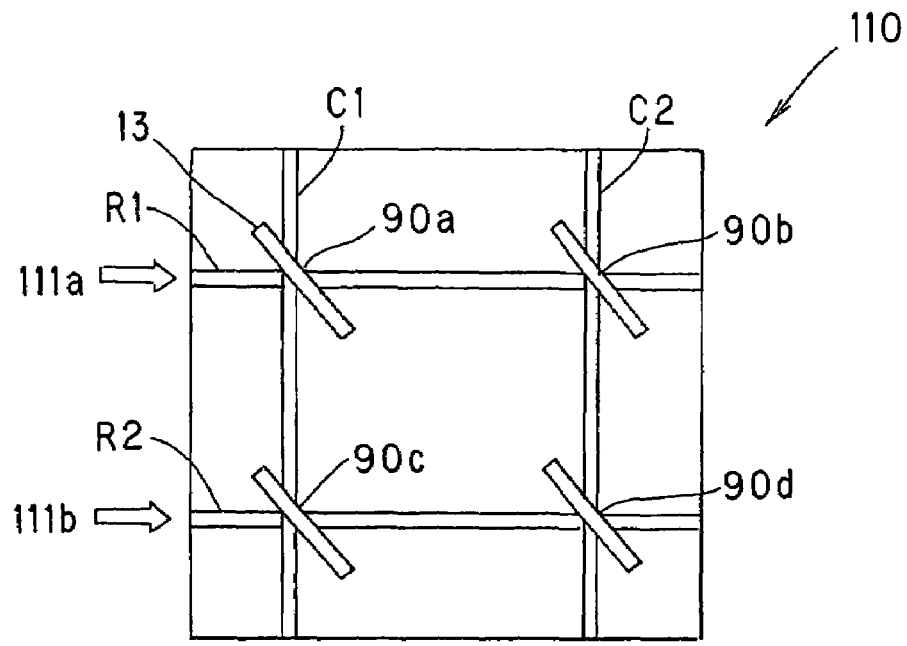
FIGS. 11($a$) and ($b$) show a horizontal cross sectional view of a waveguide switch in which a plurality of optical switches shown in FIG. 9($a$) are used, FIG. 11($a$) shows a horizontal cross section of the optical switch in a level of a micro slit, and FIG. 11($b$) shows a horizontal section of the optical switch in a level of the cell.
Figure 11B:
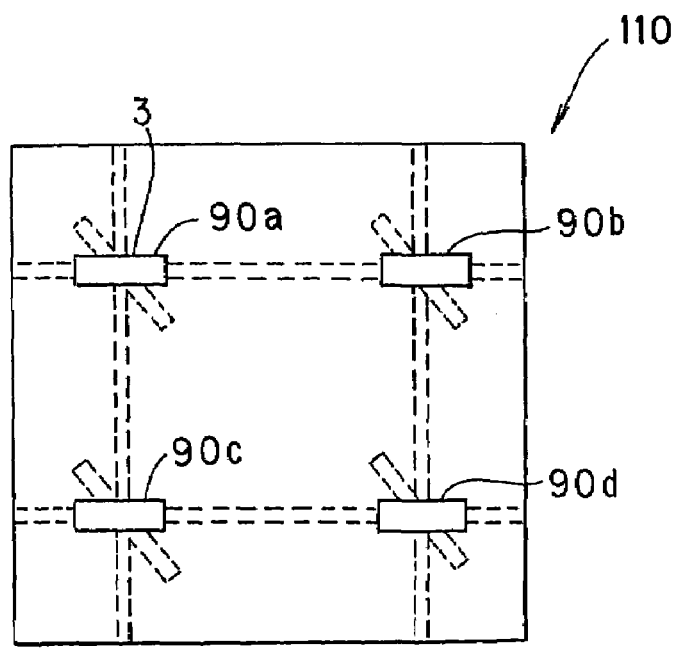

FIGS. 11(a), 11(b) are horizontal sectional views showing the application example of the optical switch 90, such as a waveguide switch 110. In the switch, optical waveguide s C1, C2, R1, R2 are disposed in the form of a well on a substrate formed of silica, and optical switches 90a to 90d are disposed in intersecting places. FIG. 11(a) shows a horizontal cross section of the optical switch in a level of the micro slit 13, and FIG. 11(b) shows a horizontal cross section of the optical switch in a level of the cell 3.

As shown in FIG. 11(a), in the waveguide switch 110, optical signals 111a, 111b enters the optical waveguide s R1 and R2 (shown left directions), respectively. At this time, when all the optical switches, that is, all the actuators are ON, both the optical signals 111a, 111b travel straight in the optical waveguide s R1, R2. Moreover, for example, when only the optical switch 90a turns OFF, the optical signal 111b travels straight in the optical waveguide R2, but, for example, the optical signal 111a turns right in the optical switch 90a, and is guided into the optical waveguide C1. When the optical switch 90c is ON, the optical signal travels straight in the optical waveguide C1. In this manner, it is possible to define various paths of the optical signals.

Figure 12A:
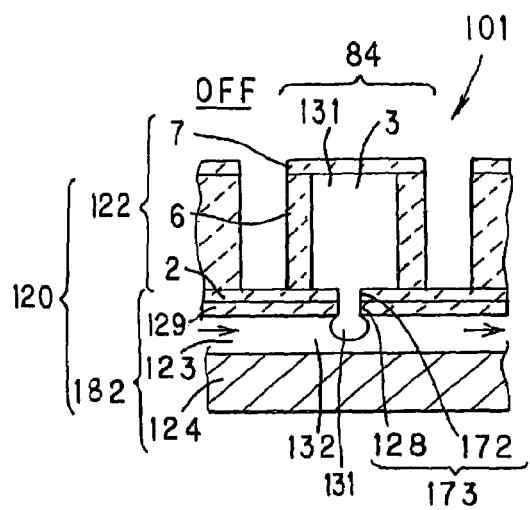
FIGS. 12($a$) and ($b$) show a cross sectional view of one embodiment of a micro pump to which the cell driving type piezoelectric/electrostrictive actuator according to the present invention is applied, FIG. 12($a$) shows the non-activated state, and FIG. 12($b$) shows the activated state.
Figure 12B:
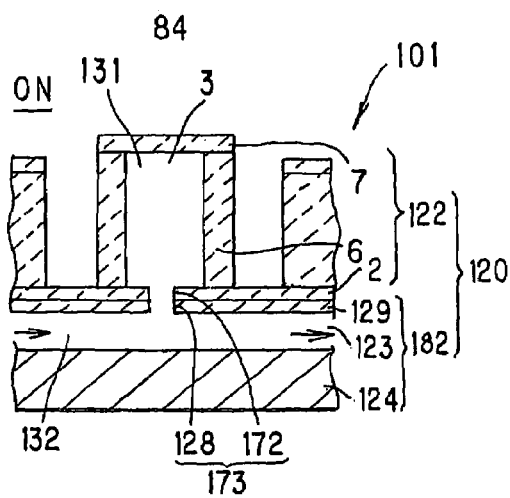

Next, FIGS. 12(a), 12(b) are cross sectional views showing one embodiment of a micro pump to which the cell driving type piezoelectric/electrostrictive actuator according to the present invention is applied. FIG. 12(a) shows the non-activated state (OFF), and FIG. 12(b) shows the activated state (ON). A shown micro pump 101 includes one pump section 84, and comprises a pump unit (A) 120. The pump unit (A) 120 comprises an actuator section 122 and a flow path section 182. In the micro pump 101, the cell driving type piezoelectric/electrostrictive actuator according to the present invention constitutes the actuator section 122. The cell 3 disposed in the actuator section 122 is formed by the side wall 6 comprising the piezoelectric/electrostrictive device, and a flow path 123 is formed between a casing 124 and a nozzle plate 129 in the flow path section 182. The cell 3 is connected to the flow path 123 via a communicating hole 173 in which a communication opening 172 of the cell 3 communicates with a nozzle 128. The flow path 123 is formed to have a width approximately equal to a diameter of the communicating hole 173 in at least a place where the communicating hole 173 communicates with the flow path 123.

The pump unit (A) 120 of the micro pump 101 changes the volume of the cell 3 by the contraction/expansion of the vertical direction of the cell 3 in the drawing, and a system fluid 131 charged in the cell 3 can be injected protrudently or retracted with respect to the flow path 123 of the flow path section 182 in which a fluid 132 insoluble to the system fluid 131 flows. In other words, a volume of the system fluid 131, charged in the cell 3, entering a flow path 123 side from the communicating hole 173 can be changed. The flow path 123 of the fluid 132 is selectively formed by this operation, and can function as a pump.

Figure 13A:
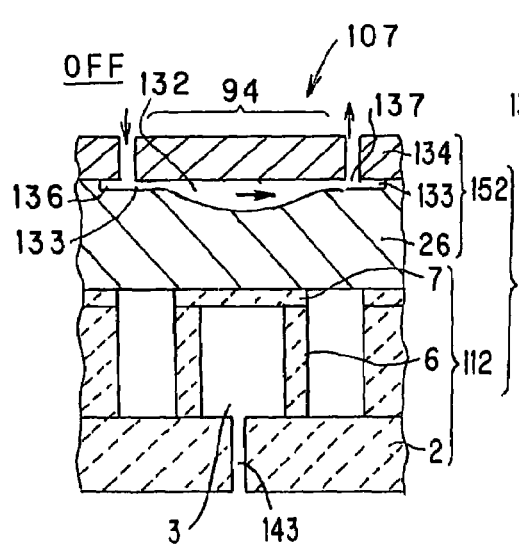
FIGS. 13($a$) and ($b$) show a cross sectional view of another embodiment of the micro pump to which the cell driving type piezoelectric/electrostrictive actuator according to the present invention is applied, FIG. 13($a$) shows the non-activated state, and FIG. 13($b$) shows the activated state.
Figure 13B:
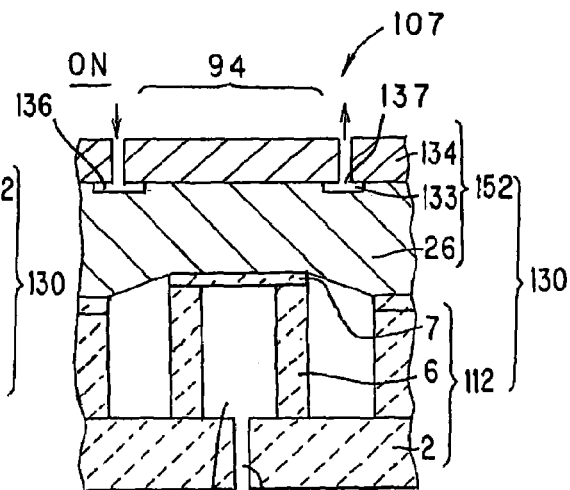

Next, FIGS. 13(a), 13(b) are cross sectional views showing another embodiment of the micro pump to which the cell driving type piezoelectric/electrostrictive actuator according to the present invention is applied. FIG. 13(a) shows the non-activated state (OFF), and FIG. 13(b) shows the activated state (ON). A micro pump 107 includes one pump section 94, and comprises a pump unit (B) 130. The pump unit (B) 130 comprises an actuator section 112 and a flow path section 152. In the micro pump 107, the cell driving type piezoelectric/electrostrictive actuator according to the present invention constitutes the actuator section 112. In the actuator section 112, the cell 3 includes a communicating hole 143 communicating with the outside of the cell, and the contraction/expansion of the side wall 6 is facilitated. The flow path section 152 comprises a displacement transmission section 26 at least a part of which is bonded to the ceiling wall 7 of the cell 3 of the actuator section 112, and a casing 134 facing the surface of a part of the displacement transmission section 26 on a side opposite to the actuator section 112 via a flow path 133.

In the pump unit (B) 130 of the micro pump 107, the displacement transmission section 26 approaches/leaves the surface of a part of the facing casing 134 by the contraction/expansion of the side wall 6 constituting the cell 3 in the vertical direction. Through the approaching/leaving, the flow path 133 of the fluid 132 is selectively formed, and can function as the pump.

In the micro pump 107, the flow path 133 may also be formed beforehand on a discharge side from an introduction side. This is advantageous in the response. When the flow path 133 is potentially present, and the displacement transmission section 26 most approaches the surface of a part of the facing casing 134, the displacement transmission section 26 may also contact the casing 134. Then, a compression or decompression ratio of the fluid 132 is enhanced, and further compact micro pump may be provided. In the pump unit (B) 130, an introductory flow path 136 and a discharge flow path 137 are formed on introductory and discharge sides which are not easily influenced by the approaching/leaving of the displacement transmission section 26 with respect to the surface of one part of the casing 134 by the displacement of the side wall 6 of the cell 3. In a portion between the flow paths, as shown in FIG. 13(*a*), the displacement transmission section 26 separates the casing 134, and the flow path 133 is formed in the non-activated state. As shown in FIG. 13(*b*), the flow path 133 is not formed at the time of activating since the displacement transmission section 26 and the casing 134 are contacted each other.

Figure 14A:
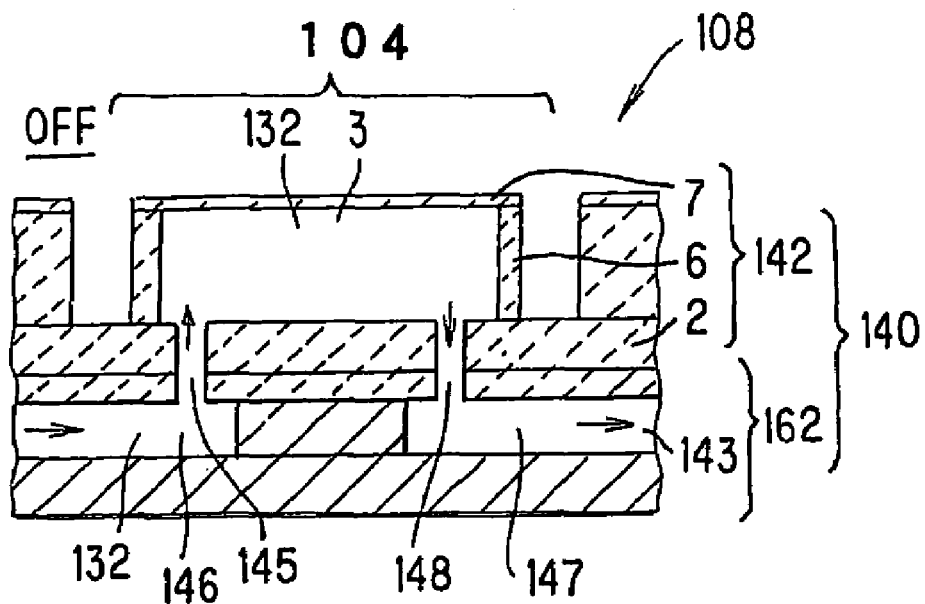
FIGS. 14($a$) and ($b$) show a cross sectional view of still another embodiment of the micro pump to which the cell driving type piezoelectric/electrostrictive actuator according to the present invention is applied, FIG. 14($a$) shows the non-activated state, and FIG. 14($b$) shows the activated state.
Figure 14B:
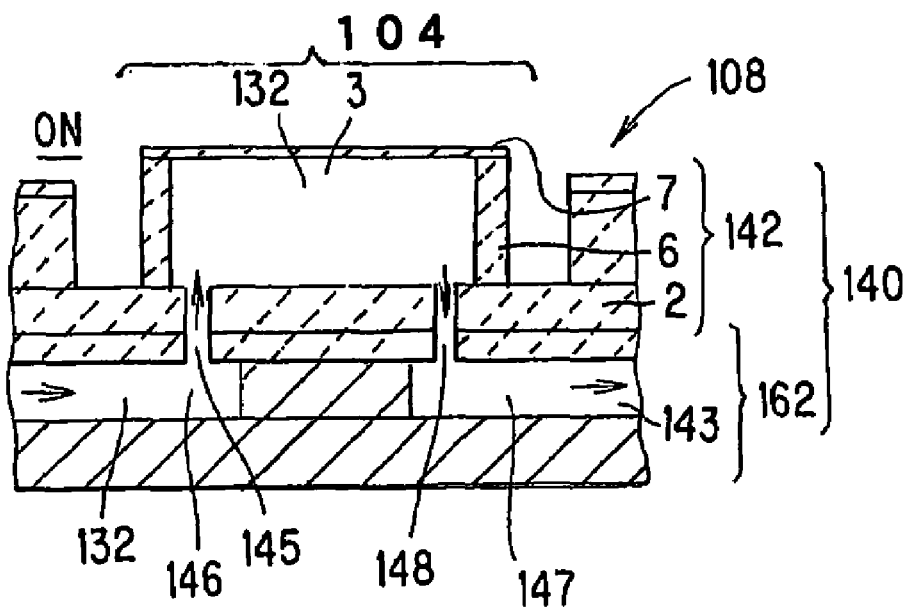

Subsequently, FIGS. 14(*a*), 14(*b*) are cross sectional views showing still another embodiment of the micro pump to which the cell driving type piezoelectric/electrostrictive actuator according to the present invention is applied. FIG. 14(*a*) shows the non-activated state (OFF), and FIG. 14(*b*) shows the activated state (ON). A micro pump 108 includes one pump section 104, and comprises a pump unit (C) 140. The pump unit (C) 140 comprises an actuator section 142 and a flow path section 162. In the micro pump 108, the cell driving type piezoelectric/electrostrictive actuator according to the present invention constitutes the actuator section 142. In the actuator section 142, a fluid introductory opening 145 and a fluid discharge opening 148 are open. In the flow path section 162, a flow path 143 is formed beforehand which comprises an introductory flow path 146 and a discharge flow path 147 and in which the fluid 132 flows. The introductory flow path 146 is connected to the fluid introductory opening 145 of the cell 3, and the discharge flow path 147 is connected to the fluid discharge opening 148 of the cell 3.

In the pump unit (C) 140 of the micro pump 108, as shown in FIG. 14(*b*), the volume of the cell 3 is changed by the contraction/expansion of the side wall 6 constituting the cell 3 in the vertical direction to generate a pressure in the cell 3, and the cell 3 itself forms a part of the flow path 143 to selectively form the flow path 143 in which the fluid 132 flows, and can function as the pump.

Figure 15A:
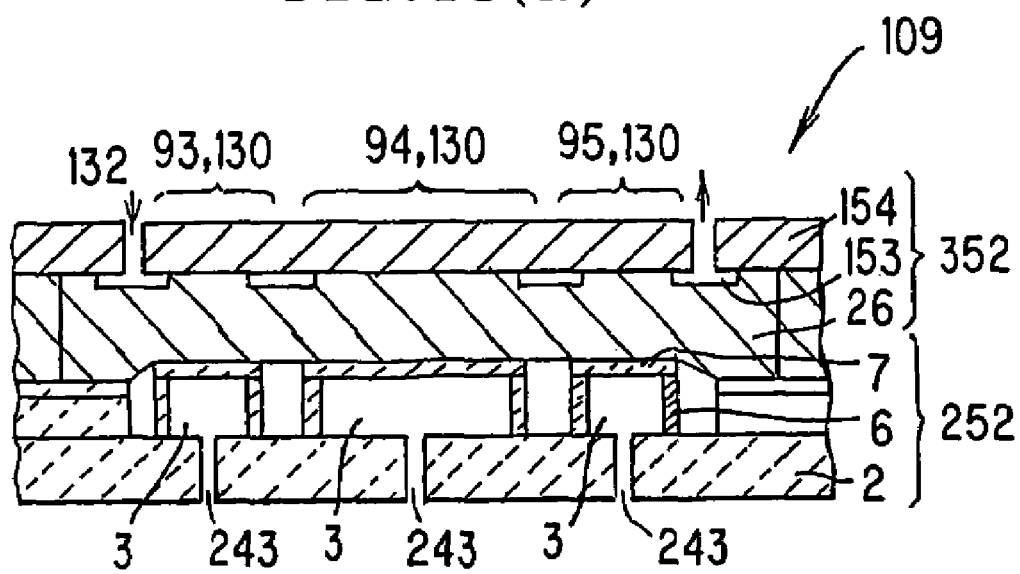
FIGS. 15($a$) and ($b$) show a cross sectional view of further embodiment of the micro pump to which the cell driving type piezoelectric/electrostrictive actuator according to the present invention is applied, FIG. 15($a$) shows a vertical cross section, and FIG. 15($b$) shows a horizontal cross section in a flow path level in FIG. 15($a$)
Figure 15B:
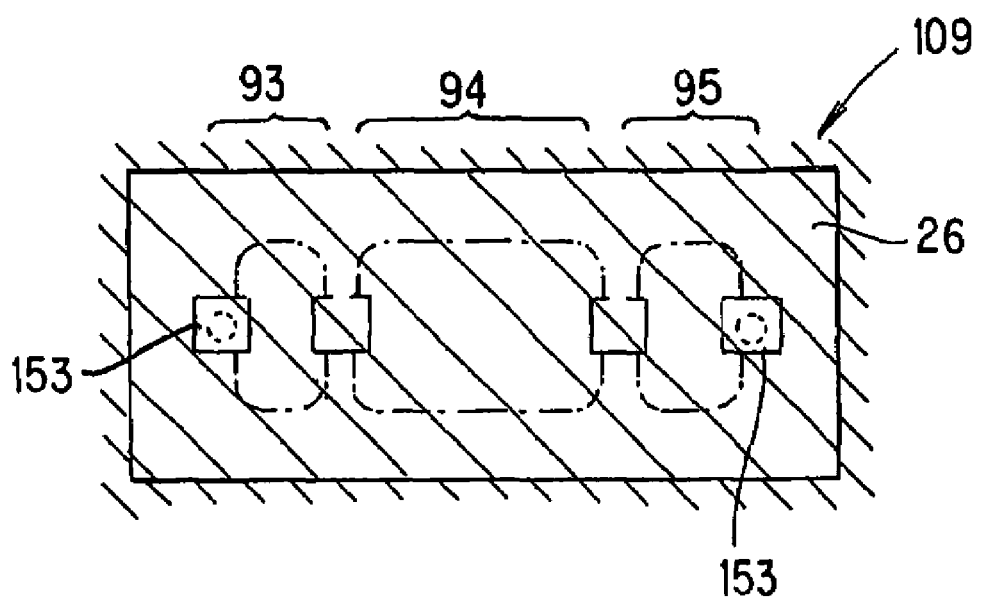

Next, FIGS. 15(*a*), 15(*b*) are cross sectional views showing further embodiment of the micro pump to which the cell driving type piezoelectric/electrostrictive actuator according to the present invention is applied. FIG. 15(*a*) shows a vertical cross section, and FIG. 15(*b*) shows a horizontal cross section in a flow path 153 level in FIG. 15(*a*).

A micro pump 109 includes one pump section 94, one input valve section 93, and one output valve section 95. Each of these pump section 94, input valve section 93, and output valve section 95 comprises a pump unit (B) 130 including: a flow path section 352 including a displacement transmission section 26 at least a part of which is bonded to the ceiling wall 7 of the cell 3 of an actuator section 252, and a casing 154 facing the displacement transmission section via the partially potentially existing flow path 153 in the surface of a part of the displacement transmission section 26 on the side opposite to the actuator section 252; and the actuator section 252 in which communicating holes 243 are disposed in the substrate 2 on the opposite side of the flow path section 352 and which includes easily deformable cells 3.

For the micro pump 109, the flow path 153 is selectively formed in one surface of the casing 154 through a selective displacement operation performed by the displacement transmission section 26 with respect to the surface of one part of the casing 154 in an approaching/leaving direction by the contraction/expansion of the side wall 6 of the cell 3 in the vertical direction in the drawing in each of the input valve section 93, pump section 94, and output valve section 95, and a function of controlling the flow of the fluid 132 is achieve.

Next, a method of manufacturing the cell driving type piezoelectric/electrostrictive actuator according to the present invention will be described. The method of manufacturing the cell driving type piezoelectric/electrostrictive actuator according to the present invention is a method of manufacturing the actuator comprising a plural number of cells each of which is defined by two side walls arranged in a predetermined manner on a substrate, and a ceiling wall connecting the respective two side walls. This type of actuator comprises at least the two side walls having piezoelectric/electrostrictive devices; each of the piezoelectric/electrostrictive devices comprising a plurality of layered piezoelectric/electrostrictive bodies and electrode layers which are alternately stacked, and the end portions of the electrodes are embedded in the piezoelectric/electrostrictive bodies at the internal side of at least the cell. During the manufacturing, as described later, mainly a green sheet laminating method is used, and punching is preferably used as supplementary means in forming the slits, holes and the like.

One example of schematic steps of the method of manufacturing the cell driving type piezoelectric/electrostrictive actuator according to the present invention is shown in FIGS. 6(*a*) to 6(*e*). A preparation object is a cell driving type piezoelectric/electrostrictive actuator 601 shown in FIG. 6(*e*). The cell driving type piezoelectric/electrostrictive actuator 601 is an actuator of a type (referred to as a face type) including communicating holes in the substrate on a lower surface side which is not exposed in the drawing. For the actuator of the face type, the density of the communicating holes is easily raised, and the actuator is preferable as an actuator for the above-described micro pump or optical switch.

The manufacturing steps will be described hereinafter. First, a predetermined number of ceramic green sheets 616 formed of piezoelectric/electrostrictive materials which are main components are prepared. The ceramic green sheets (hereinafter also referred to simply as the sheets) can be prepared by a ceramic manufacturing method which has heretofore been known. For example, a piezoelectric/electrostrictive material powder is prepared, and a binder, solvent, dispersant, plasticizer or the like is mixed into the material in a desired composition to prepare a slurry. After defoaming the slurry, it is possible to form the ceramic green sheet by sheet forming methods such as a doctor blade method, a reverse roll coater method, and a reverse doctor roll coater method.

Next, the explanation on piezoelectric/electrostrictive material usable for the present cell driving type piezoelectric/electrostrictive actuator will be made. Indeed, any kind of the piezoelectric and/or electrostrictive materials may be usable for the formation of the present cell driving type piezoelectric/electrostrictive actuator as far as it does not affect adversely on the performance thereof. That is, there are no particular requirements as far as the material causes electric field induced strains such as the piezoelectric effect and/or electrostrictive effect. The material may also be either crystalline or amorphous, or a semiconductor ceramic, ferroelectric ceramic, or antiferroelectric ceramic may also be used. The material may also be appropriately selected and use in accordance with the application. The material may require the polarization or not. Concrete example of preferable materials include a ceramic containing lead zirconate, lead titanate, lead magnesium niobate, lead nickel niobate, lead nickel tantalite, lead zinc niobate, lead cobalt niobate, lead manganese niobate, lead antimony stannate, lead manganese tungstate, lead magnesium tungstate, lead manganese tantalite, barium titanate, sodium bismuth titanate, bismuth neodymium titanate (BNT), potassium sodium niobate, strontium bismuth tantalite, copper barium tungsnate, bismuth ferrate, or a complex oxide containing at least two kinds of those materials.

Furthermore, the piezoelectric/electrostrictive material may be a piezoelectric/electrostrictive material containing further therein at least an oxide selected from the group consisting of lanthanum, calcium, strontium, molybdenum, tungsten, barium, niobium, zinc, nickel, manganese, cerium, cadmium, chromium, cobalt, antimony, iron, yttrium, tantalum, lithium, bismuth, tin, copper and the like in the form of a solid solution. One may use a piezoelectric/electrostrictive material which further contains lithium bismuthate, or lead germanate. That is, such a material is a piezoelectric/electrostrictive material comprising a complex oxide of lead zirconate, lead titanate and lead magnesium niobate, and lithium bismuthate or lead germanate as an additive. This complex oxide containing material may be preferably used for the formation of the present device since the material can show high material characteristics, while it can be fired at relatively lower temperature. A firing of the piezoelectric/electrostrictive material at a relatively lower temperature can be also achieved by using a material prepared by adding a glass, such as for example, a silicate glass, a borate glass, a phosphate glass, a germanate glass or any mixture thereof to the piezoelectric/electrostrictive material. The amount of the glass material to be added could be desirably chosen, depending upon the required performances of the device to be produced, since an excessive addition of the glass often causes the deterioration of the material characteristics of the device produced.

Moreover, conductor films 618 (films composed of an electric conductive material as a major component) constituting one electrode later are formed in predetermined patterns in approximately the half of the remaining sheets 616 excluding sheets constituting the ceiling wall and substrate later by methods such as screen printing, and conductor films 619 (films composed of a conductive material as a major component) constituting another electrode later are formed in the predetermined patterns in approximately the half of the sheets by the methods such as the screen printing (FIG. 6(*a*)). As the material of the electrode, in general, an electric conductive metal which is solid at room temperature is used. Examples include one of aluminum, titanium, chromium, iron, cobalt, nickel, copper, zinc, niobium, molybdenum, ruthenium, palladium, rhodium, silver, tin, tantalum, tungsten, iridium, platinum, gold, and lead, or an alloy of two or more of them, such as silver-platinum, silver-palladium and platinum-palladium. One material alone or a combination of two or more of the materials is preferably used. Alternatively, one may use a mixture between at least one of these materials mentioned above and any one of aluminum oxide, zirconium oxide, titanium oxide, silicon oxide, cerium oxide, glass, and piezoelectric material or a cermet thereof. These materials are preferably selected in accordance with the kind of the piezoelectric/electrostrictive material. Any one of the conventionally used means such as lithography and the like may do the pattern formation.

Next, as shown in FIG. 6(*b*), for the preparation of a sheet 607 to be used for constituting the ceiling wall later, a plural number of slit holes 625 is opened in the sheet 616 having no conductor film formed thereon by a punching method, for example, using a punch and die apparatus. Said plural number of slit holes 625 does not constitute the cells, but the spaces between the respective two adjacent cells. Similarly, for the preparation of a sheet 602 to be used for constituting the substrate later, communicating holes 643 is opened in the sheet 616 having no conductor film formed. Similarly, for the preparation of sheets 614 and 625, a plural number each of slit holes 605 and slit holes 625 is opened respectively in the sheets on which the conductor films 618 or the conductor films 619 have been formed beforehand. The slit holes 605 constitute the cells later, but the slit holes 625 do not constitute cells, but the spaces between the respective two adjacent cells later. Wall portions between the slit holes 605 and 625 in the sheets 614 and 615 constitute side walls (piezoelectric/electrostrictive devices) later.

For the cell driving type piezoelectric/electrostrictive actuator according to the present invention, in the piezoelectric/electrostrictive device in which a plurality of layered piezoelectric/electrostrictive bodies and the electrodes are alternately stacked, the end portions of the electrodes are embedded in the piezoelectric/electrostrictive bodies at at least the internal side of the cell. Therefore, in the step shown in FIG. 6(*b*), at least the slit holes 605 are opened in portions which do not contact the conductor films 618, and 619 in obtaining the sheets 614, and 615. Needless to say, it is determined by a relative positional relation whether or not the slit holes 605 contact the conductor films 618, 619. Therefore, in the step shown in FIG. 6(*a*), the conductor films 618, 619 may also be formed apart from the positions where the slit holes 605 are to be opened.

Next, as shown in FIG. 6(*c*), a predetermined number of sheets of the sheets 614, 615 are alternately stacked between the sheets 607 and 602, and compression-bonded to obtain a ceramic green laminated body having a predetermined thickness. Then, after firing the body to form an integrated laminated body, an unnecessary portion is cut and removed along a cut line 650 by means such as wire saw working so that the electrodes formed by firing the conductor films 618, 619 formed on the sheets 614, 615 appear (FIG. 6(*d*)). Next, individual electrodes 620 and common electrodes 621 are formed and connected to the electrodes which have appeared on the upper and side surfaces of the fired laminated body 610. Then, these electrodes are electrically connected every other layer in a part different from two side walls comprising the piezoelectric/electrostrictive devices (part distant from the slit holes 605 and 625 or the wall portions between the holes in the sheets 614, 615). In other words, the electrodes formed by firing the conductor films 618, or the electrodes formed by firing the conductor films 619 are mutually connected. Thereafter, the polarization is performed if necessary to obtain the cell driving type piezoelectric/electrostrictive actuator 601. Using an unfired ceramic green laminated body may do the processing along the cutting line 650. In that case, one may form individual electrodes before firing the green laminated body, and fire the individual electrodes simultaneously with the cut unfired ceramic green laminated body.

Additionally, it is preferable to form a bonding-assistant layer on a green sheet, or between the green sheets to improve the lamination condition of the green sheets, i.e., the unification of the laminated body. Furthermore, one may form a bonding-assistant layer on the surface of the conductor film to flatten the unevenness of the surface of the green sheet on which a conductor film is formed. This is because, more or less, the surface becomes uneven, dependent upon the patterns of the conductor film(s) formed thereon. The unevenness can be flattened by forming the bonding-assistant layer, however, the flattening of the unevenness of the surface can be preferably achieved by subjecting the sheet to compression treatment by using a pressing machine or the like prior to the lamination, then thus flattened sheet is stacked with other green sheets to form a ceramic green laminated body, and the resultant laminated body is compression-bonded. More preferably, one may use jointly the formation of the bonding-assistant layer and the flattening by the mechanical means.

In the above description, it has been described in the step that the slits 605, 625 are opened in the sheets 614, 615, and thereafter the sheets are aligned and stacked on the sheet 602 in order to obtain the ceramic green laminated body in which the sheets 614, 615 are alternately stacked between the sheets 607 and 602. However, the sheets 614, 615 may also be laminated, while making the slits 605, 625 (simultaneous punching/stacking). This will be described hereinafter with reference to the drawings.

FIGS. 18(*a*) to 18(*e*) shows a concrete example of a method for the above-described simultaneous punching and stacking. One may use a mold including a punch 10 around which a stripper 11 for stacking the sheets is disposed and a die 12. Hereinafter the respective steps are referred to as the step A and the like, for easier identification. FIG. 18(*a*) shows a state, before the punching, of a sheet (referred to as a sheet 616*a*) having no conductor film formed thereon and being laid as a first sheet on the die 12. In FIG. 18(*b*), the punch 10 and stripper 11 are lowered to punch the sheet 616*a* to form the slit holes 605 and 625 respectively (both slit holes omitted to show) (step A).

Next, for example, preparations for the punching of a second sheet (referred to as a sheet 616*b*) having the conductor films 618 formed are made. At this time, as shown in FIG. 18(*c*), the first sheet 616*a* is brought in close contact with the stripper 11 to move up the sheet, and the first sheet is detached from the die 12 (step B). A method of bringing the sheet in close contact with the stripper 11 can be performed, for example, by vacuum suction after a suction hole is formed in the stripper 11.

Moreover, in preparation for the punching of the second sheet 616*b*, the punch 10 and stripper 11 are lifted up from the die 12. During the lifting-up, preferably a tip portion of the punch 10 is not returned into the slit hole of the first sheet 616*a* lifted up together. To stop the sheet lifting, it is important to stop the punch in a place where the tip portion of the punch is slightly retracted from a lowermost portion of the first sheet 616*a* lifted up together (step C). If the punch 10 is returned into the hole of the first sheet 616*a*, or completely stored in the stripper 11, the formed hole is deformed because the sheet is soft. In the ceramic green laminated body obtained by stacking the sheets including the slits, flatness of the side surface in which the slits are superposed to form a slit through hole is unfavorably deteriorated.

FIG. 18(*d*) shows a punching step of the second sheet 616*b*. When the first sheet 616*a* is allowed to closely contact the stripper 11, the second sheet 616*b* can easily be laid on the die 12, and is punched as in the step of FIG. 18(*b*), and further superposed upon the first sheet 616*a* (step D).

Moreover, the steps illustratively shown in FIGS. 18(*c*) and 18(*d*) are repeated to stack (superpose) the punched first sheet 616*a* upon the second sheet 616*b*, and the sheets are lifted up by the stripper 11 (step E) to enter the preparations for the punching of a third sheet on which the conductor films 619 are formed. Although not shown, it is also important to stop the tip of the punch in a position slightly retracted from a lowermost portion of the sheet lifted up together (step F). Thereafter, the steps D to F are repeated to punch and stack a required number of sheets.

FIG. 18(*e*) shows a state assuming that the punching ends by three layers for the sake of description. After the end of the punching and stacking of the sheets, the holding of the sheets by the stripper 11 is released. By the above-described steps, the sheets having no slit (sheets 616*a*, 616*b*, etc.) are converted into the sheets 614, 615 in which the slits 605, 625 (both slits not-shown) are opened already and stacked simultaneously to constitute the ceramic green laminated body. When the holding of the sheets is released, the ceramic green laminated body is detached from the stripper 11. The stripper 11 can be securely detached from the ceramic green laminated body with a detaching jig 17 disposed in the lower surface of the stripper 11 as shown.

Subsequently, another example of the schematic steps of a method for manufacturing a cell driving type piezoelectric/electrostrictive actuator according to the present invention is shown in FIGS. 7(*a*) to 7(*c*). The preparation object is a cell driving type piezoelectric/electrostrictive actuator 701 shown in FIG. 7(*c*). The cell driving type piezoelectric/electrostrictive actuator 701 is an actuator of the face type similar to the cell driving type piezoelectric/electrostrictive actuator 601 shown in FIG. 6(*e*). Unlike the cell driving type piezoelectric/electrostrictive actuator 601 in which one row of cells (slits) are disposed, two rows of cells (slits) are disposed.

Moreover, the actuator is different from the cell driving type piezoelectric/electrostrictive actuator 601 in the forming pattern of the electrode (conductor film). Moreover, the electric connection of the electrode every other layer is not performed by the individual electrodes 620 and common electrodes 621 formed on the outer surface (upper or side surface) as in the cell driving type piezoelectric/electrostrictive actuator 601, and is performed by a via hole (or a through hole) extending through a portion other than the side wall comprising the piezoelectric/electrostrictive device inside the cell driving type piezoelectric/electrostrictive actuator 701. In this configuration, the cutting step by the dicer or the like as in FIG. 6 is not performed, and it is not necessary to form the electrodes on the end surface.

The manufacturing steps will be described hereinafter. First, the predetermined number of ceramic green sheets 716 made of a piezoelectric/electrostrictive material as a major component is prepared. The sheets to be used for constituting the ceiling wall and substrate later, respectively are taken out therefrom. Then, conductor films 718 (films composed of a conductive material as a major component) to be used for constituting one electrode later are formed in the predetermined patterns in approximately the half of the remaining sheets 716 by the methods such as screen printing. Similarly, conductor films 719 (films composed of a conductive material as a major component) to be used for constituting the other electrode later are formed in the predetermined patterns in approximately the half of the sheets by the methods such as the screen printing (see FIG. 7(a)).

Next, for example, by the punching, for example, by using the punch and die, a plural number of slit holes 725 is opened in the sheet 716 having no conductor film formed thereon to prepare a sheet 707 to be used for constituting the ceiling wall later. The slit holes 725 are used to constitute the space between the two adjacent cells later. Similarly, communicating holes 743 are opened in the sheet 716 having no conductor film formed thereon to prepare a sheet 702 to be used for constituting the substrate later. Similarly, a predetermined number of sheets 714 was prepared by forming slit holes 705 and slit holes 725 in the sheets having conductor films 718 formed thereon beforehand. A predetermined number of the sheets 715 was also prepared by forming slit holes 705 and slit holes 725 in the sheets having the conductor films 719 formed thereon. The slit holes 705 constitute the cells later, and the slit holes 725 are used to form the spaces between the respective two adjacent cells later. The holes that are used to form via holes 712, 713 by filling them with a conductor material are opened in the sheets 707, 714, and 715 in predetermined positions, for example, by the punching.

It is to be noted that to obtain the sheets 714, 715, at least the slit holes 705 are opened in positions which do not contact the conductor films 718, 719 in the same manner as in the preparation of the cell driving type piezoelectric/electrostrictive actuator 601.

Next, the sheets 714, 715 are alternately stacked between the sheets 707 and 702, and compression-bonded to obtain the ceramic green laminated body having a predetermined thickness. Moreover, after the firing of thus prepared body to obtain an integrally formed laminated body by firing, terminal electrodes 720, 721 are formed and connected to the via holes 712, 713 conducted by laminating them. Thereafter, the polarization treatment is performed if necessary to obtain the cell driving type piezoelectric/electrostrictive actuator 701.

Next, still another example of the schematic steps of a method for manufacturing a cell driving type piezoelectric/electrostrictive actuator according to the present invention is shown in FIGS. 8(a) to 8(e). The preparation object is a cell driving type piezoelectric/electrostrictive actuator 801 shown in FIG. 8(e). The cell driving type piezoelectric/electrostrictive actuator 801 is an actuator of the face type conforming to the cell driving type piezoelectric/electrostrictive actuator 701 shown in FIG. 7(b). However, in this embodiment, the size of the slit hole which constitutes the space later is made smaller as compared with that of the slit hole to be used for constituting the cell later, thereby a degree of freedom in dimension of the hole is enhanced with respect to positional deviation caused by fluctuations in the size of communicating holes 843 during the manufacturing.

The manufacturing steps will be described hereinafter. First, the predetermined sheets of ceramic green sheets 816 made of a piezoelectric/electrostrictive material being as a major component are prepared. The sheets to be used for constituting the ceiling wall and the substrate later are taken out therefrom for the future use. Then, on approximately the half of the remaining sheets 816, are formed conductor films 818 (films composed of a conductive material as a major component) to be used for constituting one electrode later in the predetermined patterns by the method such as screen printing. On the remaining sheets which correspond to approximately the half of the sheets remained without being used, are formed conductor films 819 (films composed of a conductive material as a major component) constituting the other electrode later are formed in the predetermined patterns by the method such as the screen printing (FIG. 8(a)). Next, as shown in FIG. 8(b), by the punching, for example, by using the punch and die, a plural number of slit holes 825 is opened in the sheet 816 reserved for the preparation of a sheet 807 for constituting a ceiling wall. Note that thus formed slits do not constitute a cell, but a space between two adjacent independently formed cells. Similarly, communicating holes 843 are opened in the sheet 816 reserved for the preparation of a sheet 802 for constituting the substrate. Indeed, on both of the sheets, there is no formation of conductor film. Then, for the preparation of the necessary number sheets of sheets 814, a plural number each of slit holes 805 and slit holes 825 is opened respectively in the sheets on which the conductor films 818 have been formed beforehand. At the same time, for the preparation of the necessary number sheets of sheets 815, a plural number each of slit holes 805 and slit holes 825 is opened respectively in those on which the conductor films 819 have been formed. The slit holes 805 constitute the cells later and slit holes 825 are used to be formed the space between two adjacent independently formed cells. Thus prepared two kinds of the sheets 814 and 815 are used to constitute the side walls (piezoelectric/electrostrictive devices) later. The holes which are to be used as via holes 812, 813 by filling them with a conductor material are formed in predetermined positions, for example, by the punching in the sheet 807, the sheets 814, the sheets 815.

It is to be noted that, at the time of preparing the sheets 814, 815, at least the slit holes 805 should be opened in the positions which do not contact the conductor films 818, 819, in the same manner as in the preparation of the cell driving type piezoelectric/electrostrictive actuators 601, 701.

Next, as shown in FIG. 8(c), the sheets 814, 815 are alternately stacked between the sheets 807 and 802, and compression-bonded to obtain a ceramic green laminated body having a predetermined thickness. Moreover, the resultant body is fired to obtain an integrally formed laminated body 810 by firing (FIG. 8(d)). Thereafter, terminal electrodes 820, 821 are formed and connected to the via holes 812, 813 conducted by laminating, and the polarization is performed if necessary to obtain the cell driving type piezoelectric/electrostrictive actuator 801 (FIG. 8(e)).

As described above in detail, according to the present invention, there are provided a piezoelectric actuator capable of solving conventional problems, being driven with a high electric field intensity with the attainment of a larger displacement. It has a high electric conducting reliability of an electrode irrespectively of kinds, compositions and the like of ink when used as an ink jet head, and can be prepared with a less number of manufacturing steps, and a method for manufacturing an actuator having the above-mentioned characteristic features. That is, the present cell driving type piezoelectric actuator can be used, for example, as a head of an ink jet printer, a mixture/reaction operation of a micro amount of solution in a biotechnology field, a micro-machine conveying device such as a linear motor, the manufacturing of DNA chips required for analyzing a genetic structure, a micro droplet discharge device for use in a coating step for manufacturing a semiconductor, a micro injecting device for discharging a small amount of a reagent(s) in the various testing methods in the medical field, and the like.

What is claimed is:

1. A cell driving type piezoelectric/electrostrictive actuator comprising: at least one cell defined by two side walls, a substrate and a ceiling wall; said two side walls being disposed on the substrate, and being covered by the ceiling wall, at least the two side walls being composed of piezoelectric/electrostrictive devices; said piezoelectric/electrostrictive devices being capable of changing a volume of said at least one cell with causing displacement in walls of the cell, wherein each of piezoelectric/electrostrictive devices comprises a plurality of layered piezoelectric/electrostrictive bodies and electrode layers which are alternately stacked, and end portions of all of the electrodes are embedded in the piezoelectric/electrostrictive bodies at an internal side of the cell.

2. The cell driving type piezoelectric/electrostrictive actuator according to claim 1 which comprises a plurality of cells each of which is formed independently of the adjacent cells, wherein end portions of electrodes of the piezoelectric/electrostrictive devices forming a cell are exposed from the piezoelectric/electrostrictive body at an external side of the cell.

3. The cell driving type piezoelectric/electrostrictive actuator according to claim 1, wherein the ceiling wall comprises the piezoelectric/electrostrictive device.

4. The cell driving type piezoelectric/electrostrictive actuator according to claim 1, wherein an electric connection is performed every other layer at a portion of the electrodes being formed on a portion other than the two side walls comprising the piezoelectric/electrostrictive devices.

5. The cell driving type piezoelectric/electrostrictive actuator according to claim 4, wherein the electric connection is performed by a through hole or a via hole.

6. An optical switch which is disposed midway in an optical path and which defines a path of an optical signal, the optical switch comprising: an actuator section comprising a cell driving type piezoelectric/electrostrictive actuator and a waveguide section including a fine slit; said cell driving type piezoelectric/electrostrictive actuator comprising: a plurality of cells each of which is formed independently of the adjacent cells and is defined by two side walls, a substrate and a ceiling wall; said two side walls being disposed on the substrate, and being covered by the ceiling wall, at least the two side walls being composed of piezoelectric/electrostrictive devices; each of said piezoelectric/electrostrictive devices being capable of changing a volume of a cell with causing displacement of walls of the cell, wherein each of piezoelectric/electrostrictive devices comprises a plurality of layered piezoelectric/electrostrictive bodies and electrode layers which are alternately stacked, and end portions of the electrodes are embedded in the piezoelectric/electrostrictive bodies at an internal side of the cell;

wherein gas is charged in a cell of the actuator section, liquid is charged in the fine slit of the waveguide section, wherein the cell is connected to the fine slit via a communicating hole, the fine slit intersects with an optical waveguide, and the cell is disposed in an intersecting place, and wherein a part of the gas charged in the cell in the intersecting place is injected protrudently into the fine slit from the communicating hole, or the gas injected protrudently into the fine slit is returned into the cell via the communicating hole to change a refractive index of the fine slit inclusive of the optical waveguide section in accordance with change in volume of the cell caused by displacement of the piezoelectric/electrostrictive device.

7. A micro pump which feeds fluid by a function of pressure, comprising: at least one pump section, the pump section comprising a pump unit, the pump unit comprising at least one actuator section capable of changing pressure, and a flow path section in which the fluid flows; the actuator section comprising a cell driving type piezoelectric/electrostrictive actuator comprising a plurality of cells each of which is formed independently of the adjacent cells and is defined by two side walls, a substrate and a ceiling wall; said two side walls being disposed on the substrate, and being covered by the ceiling wall, at least the two side walls being composed of piezoelectric/electrostrictive devices; each of said piezoelectric/electrostrictive devices being capable of changing a volume of a cell with causing displacement of walls of the cell, wherein each of piezoelectric/electrostrictive devices comprises a plurality of layered piezoelectric/electrostrictive bodies and electrode layers which are alternately stacked, and end portions of the electrodes are embedded in the piezoelectric/electrostrictive bodies at an internal side of the cell, wherein a change in pressure is caused in the flow path section by displacement of a piezoelectric/electrostrictive device constituting a side wall of a cell of the actuator section to selectively form a flow path of a fluid.

* * * * *